(12) United States Patent
Wang et al.

(10) Patent No.: US 11,812,575 B2
(45) Date of Patent: *Nov. 7, 2023

(54) SERVER SYSTEM

(71) Applicant: CHENBRO MICOM CO., LTD., New Taipei (TW)

(72) Inventors: Chien-Wen Wang, New Taipei (TW); Han-Chung Chien, New Taipei (TW); Sheng-Chan Lin, New Taipei (TW); Hao-Hsiang Hsu, New Taipei (TW); Chiung-Wei Lin, New Taipei (TW); An-Hsin Chen, New Taipei (TW)

(73) Assignee: CHENBRO MICOM CO., LTD., New Taipei (TW)

( * ) Notice: Subject to any disclaimer, the term of this patent is extended or adjusted under 35 U.S.C. 154(b) by 189 days.

This patent is subject to a terminal disclaimer.

(21) Appl. No.: 17/367,798

(22) Filed: Jul. 6, 2021

(65) Prior Publication Data

US 2021/0337692 A1 Oct. 28, 2021

Related U.S. Application Data

(63) Continuation-in-part of application No. 17/324,124, filed on May 19, 2021, now Pat. No. 11,558,975, and
(Continued)

(51) Int. Cl.
*H05K 5/03* (2006.01)
*H05K 7/14* (2006.01)
(Continued)

(52) U.S. Cl.
CPC .............. *H05K 5/03* (2013.01); *H05K 5/0213* (2013.01); *H05K 5/06* (2013.01); *H05K 7/1487* (2013.01)

(58) Field of Classification Search
None
See application file for complete search history.

(56) References Cited

U.S. PATENT DOCUMENTS 4,864,469 A * 9/1989 Boudon .................. G06F 1/183
361/736
5,306,079 A * 4/1994 Liu .......................... G06F 1/183
312/223.2
(Continued)

FOREIGN PATENT DOCUMENTS

CN 108508983 A 9/2018
EP 3470957 A1 4/2019
(Continued)

*Primary Examiner* — Xanthia C Relford
(74) *Attorney, Agent, or Firm* — ScienBiziP, P.C.

(57) ABSTRACT

A server system comprises a deck, a front panel arranged on the deck and defining a collecting space; two doors arranged on opposite sides of the deck, and being perpendicular to the front panel; two receiving frame structures arranged between the doors in a back to back arrangement, and configured to receive multiple rows and columns of a plurality of storage drives horizontally, wherein two periphery corridors are each defined between one of the doors and one of the receiving frame structure facing the one door; two circuit boards arranged between the two receiving frame structures, wherein the two circuit boards comprise a plurality of slits, wherein a central corridor is defined between the two circuit boards; a storage cover disposed above the deck over the two periphery corridors, the central corridor, the two receiving frame structures, and the two circuit boards.

21 Claims, 42 Drawing Sheets

Related U.S. Application Data a continuation-in-part of application No. 17/080,873, filed on Oct. 27, 2020, now Pat. No. 11,259,437.

(60) Provisional application No. 63/026,735, filed on May 19, 2020, provisional application No. 62/927,080, filed on Oct. 28, 2019.

(51) Int. Cl.
*H05K 5/02* (2006.01)
*H05K 5/06* (2006.01)

(56) References Cited

U.S. PATENT DOCUMENTS

| | | | | |
|---|---|---|---|---|
| 9,105,309 | B2* | 8/2015 | Li | G11B 33/128 |
| 9,245,587 | B2* | 1/2016 | Chen | G06F 1/187 |
| 9,532,480 | B2* | 12/2016 | Shen | G06F 1/184 |
| 9,867,307 | B2* | 1/2018 | Kurosaki | H05K 7/1487 |
| 10,736,229 | B2* | 8/2020 | Konovalov | G11B 33/128 |
| 2008/0037209 | A1* | 2/2008 | Niazi | G06F 1/184 |
| | | | | 361/727 |
| 2011/0043994 | A1* | 2/2011 | Cheng | G06F 1/187 |
| | | | | 361/679.33 |
| 2012/0293944 | A1* | 11/2012 | Yi | H05K 7/1487 |
| | | | | 361/679.32 |
| 2013/0003317 | A1* | 1/2013 | Gong | H01R 13/72 |
| | | | | 361/826 |
| 2015/0163964 | A1* | 6/2015 | Lam | G06F 1/187 |
| | | | | 361/679.31 |
| 2017/0374768 | A1* | 12/2017 | Hughes | H05K 7/1489 |
| 2018/0131056 | A1* | 5/2018 | Sato | H05K 7/20727 |
| 2019/0073006 | A1* | 3/2019 | Chang | G06F 1/26 |
| 2020/0022287 | A1* | 1/2020 | Klein | H05K 7/20727 |
| 2020/0236815 | A1* | 7/2020 | Klein | H05K 7/20727 |
| 2020/0389993 | A1 | 12/2020 | Wang et al. | |

FOREIGN PATENT DOCUMENTS

| | | |
|---|---|---|
| EP | 3817531 A1 | 5/2021 |
| TW | 201209557 A | 3/2012 |
| TW | 201331740 A | 8/2013 |
| TW | 201921225 A | 6/2019 |
| TW | I667577 B | 8/2019 |

* cited by examiner

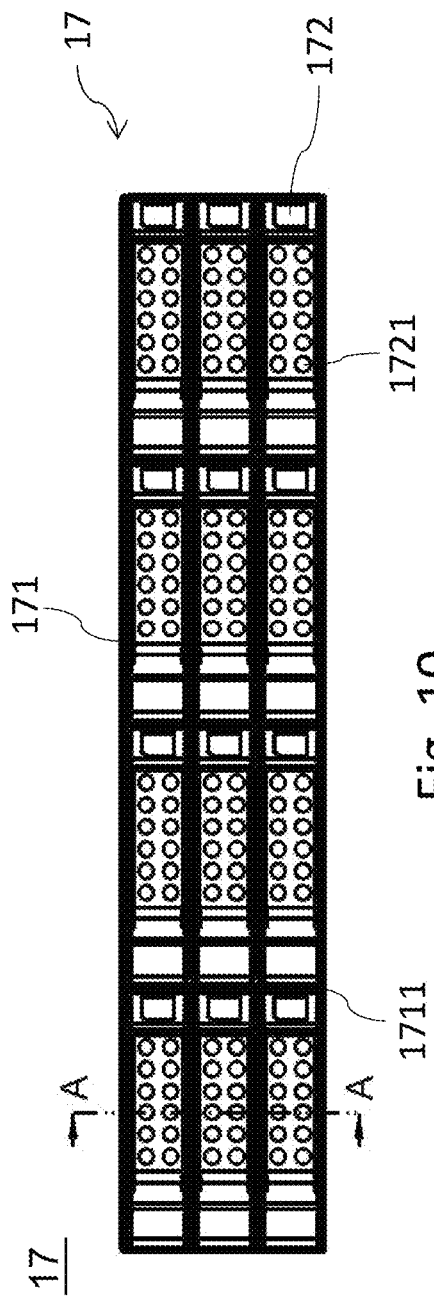
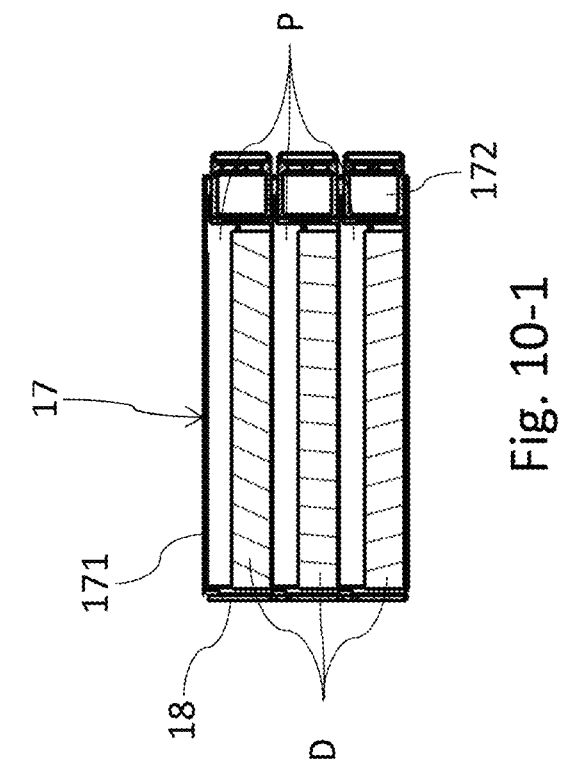
Fig. 10
Fig. 10-1

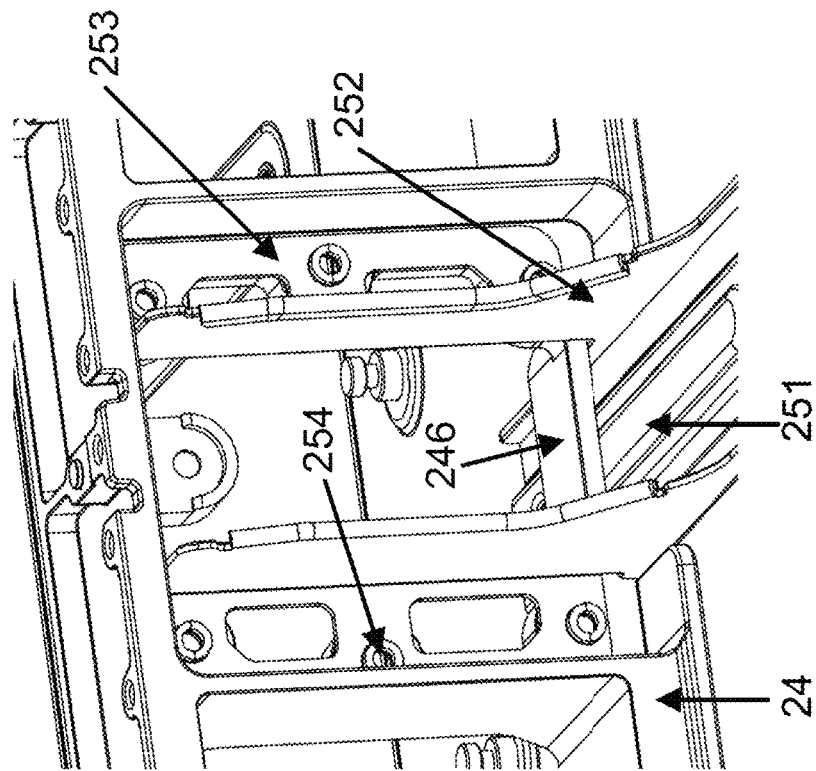
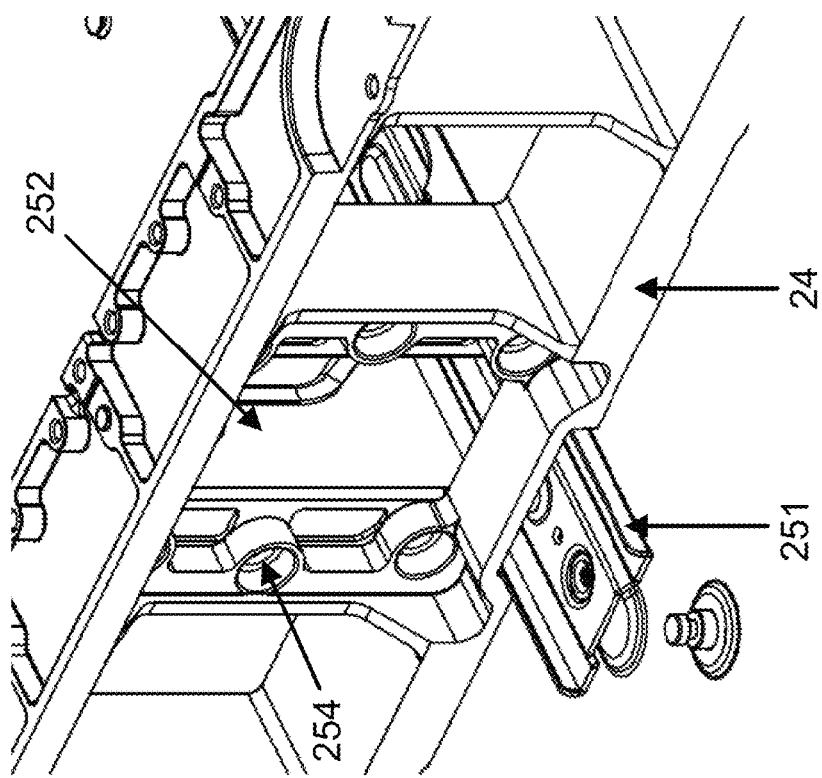

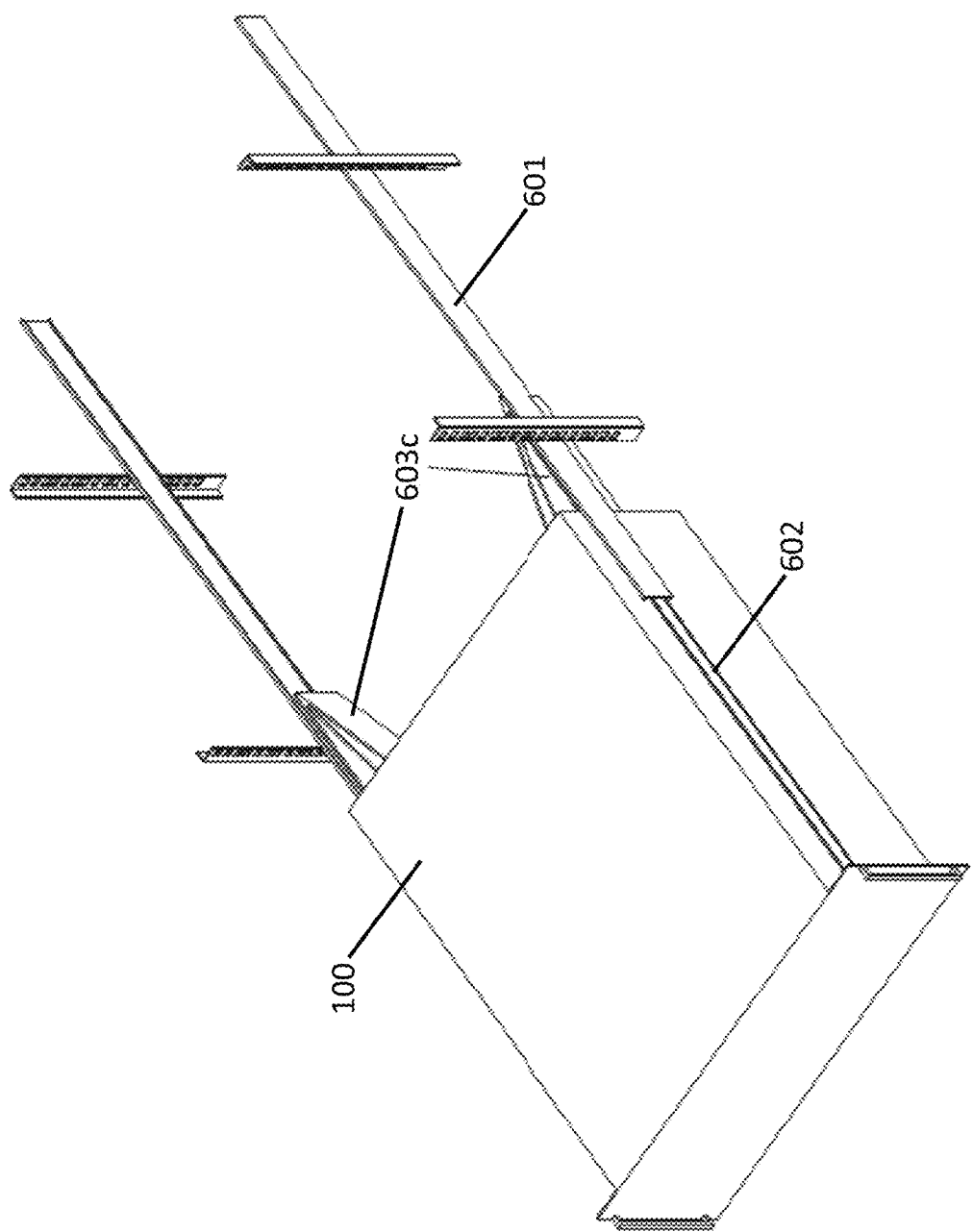

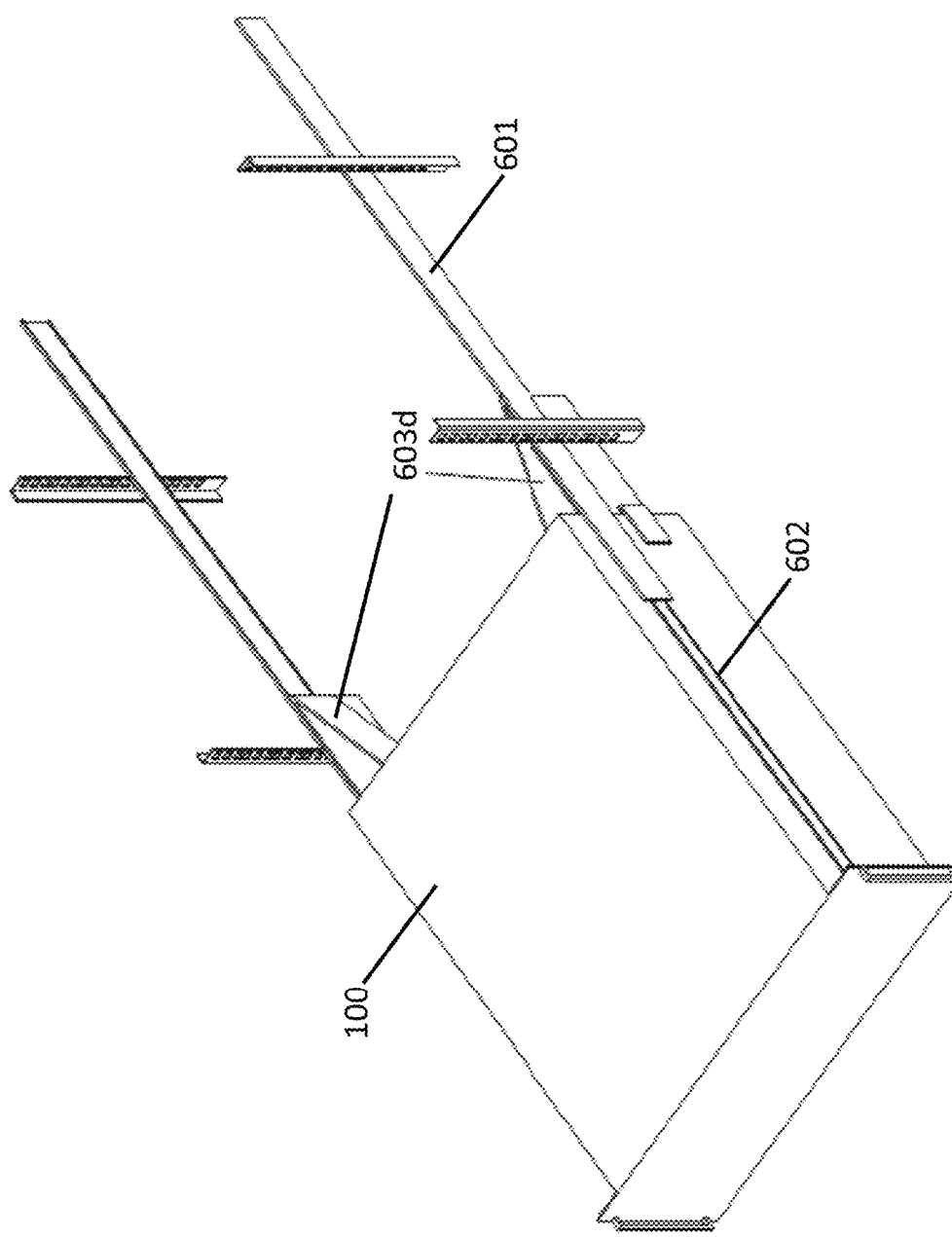

SERVER SYSTEM

CROSS-REFERENCE TO RELATED APPLICATION

This application is a Continuation-in-Part of U.S. patent application Ser. No. 17/324124 filed on May 19, 2021; which claims priority to U.S. Provisional Patent Application 63/026735 filed on May 19, 2020; which is a Continuation-in-Part of U.S. patent application Ser. No. 17/080873 filed on Oct. 27, 2020, which claims priority to U.S. Provisional Patent Application 62/927080 filed on Oct. 28, 2019. The disclosure of abovementioned priority documents are hereby incorporated by reference herein in their entirety.

FIELD

The present disclosure generally relates to a server system and other modules and components of the server system. More particularly, the present disclosure relates to a novel cooling arrangement of the server system, which allows effective cooling of side loading storage drives in the server system.

BACKGROUND

1. Field

The present disclosure generally relates to server system, and more particularly pertains to server system that has enclosure used to structurally support a load.

2. Related Art

In a conventional arrangement, server systems are usually mounted from the front of the server system rack like a drawer, and therefore it has been intuitive to arrange the majority of storage drives of the server systems at location(s) that is near a user for easy accessibility. In other words, the storage drives (e.g., hard drives) are usually arranged at the front part of the server systems, and therefore the storage drives are typically inserted or removed from a front face or a top face of the server systems. However, insertion from the front face of the server systems naturally limits the number of the storage drives by the front face area due to industrial specified width and height; insertion from the top face of the server systems requires the user to reach from above of the server systems while inserting or removing a storage drive, which is not convenient. On the other hand, insertion from the side faces of the server systems (e.g., the flank of the server system body) may increase the number of the storage drives as well as maintain easy accessibility to each storage drives. However, having more storage drives means more heat is produced within the server system. Furthermore, more storage drives under industrial specified width and height also means less available space for cooling. Therefore, side insertion of the storage drives usually has a thermal problem, which is highly undesirable to server systems.

The present disclosure provides a new arrangement of a side loading server system that incorporates enhanced heat management capability.

BRIEF DESCRIPTION OF THE DRAWINGS

Many aspects of the disclosure can be better understood with reference to the following drawings. The components in the drawings are not necessarily drawn to scale, the emphasis instead being placed upon clearly illustrating the principles of the disclosure. Moreover, in the drawings, like reference numerals designate corresponding parts throughout the several views.

FIG. 10 illustrates a front view of a component housings according to one embodiment of the present disclosure.

FIG. 10-1 illustrates the A-A cross-sectional view of FIG. 10 according to one embodiment of the present disclosure.

FIG. 26A-26E illustrates a boning structure according to one embodiment of the present disclosure.

FIG. 30A-30J illustrates an isometric view of a server system mounted to a rack according to one embodiment of the present disclosure.

DETAILED DESCRIPTION

Figure 1:
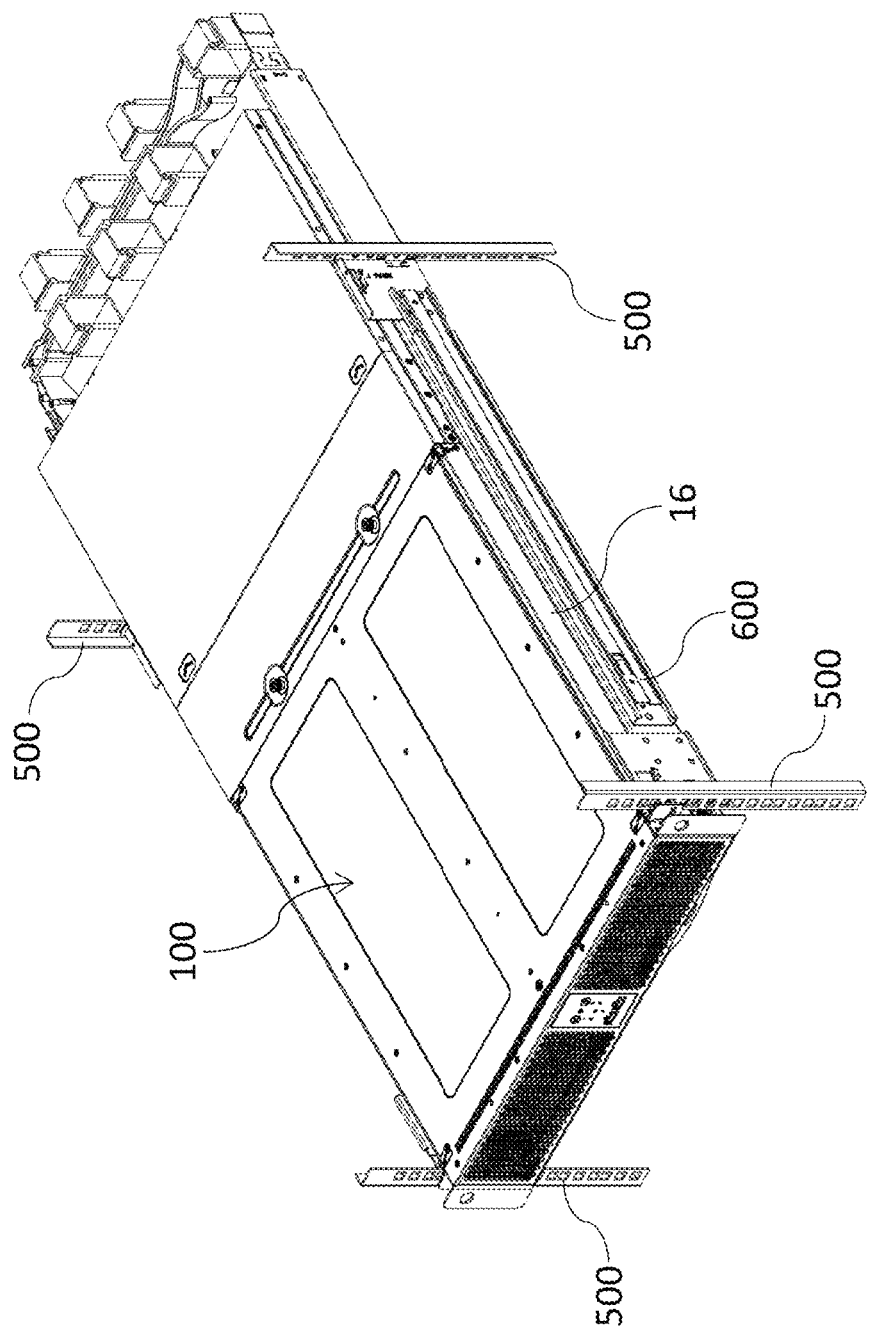
FIG. 1 illustrates an isometric view of a server system mounted to a rack according to one embodiment of the present disclosure.

It will be appreciated that for simplicity and clarity of illustration, where appropriate, reference numerals have been repeated among the different figures to indicate corresponding or analogous elements. In addition, numerous specific details are set forth to provide a thorough understanding of the embodiments described herein. However, it will be understood by those of ordinary skill in the art that the embodiments described herein can be practiced without these specific details. In other instances, methods, procedures, and components have not been described in detail so as not to obscure the related relevant feature being described. Also, the description is not to be considered as limiting the scope of the embodiments described herein. The drawings are not necessarily to scale and the proportions of certain parts may be exaggerated to better illustrate details and features of the present disclosure.

Figure 2:
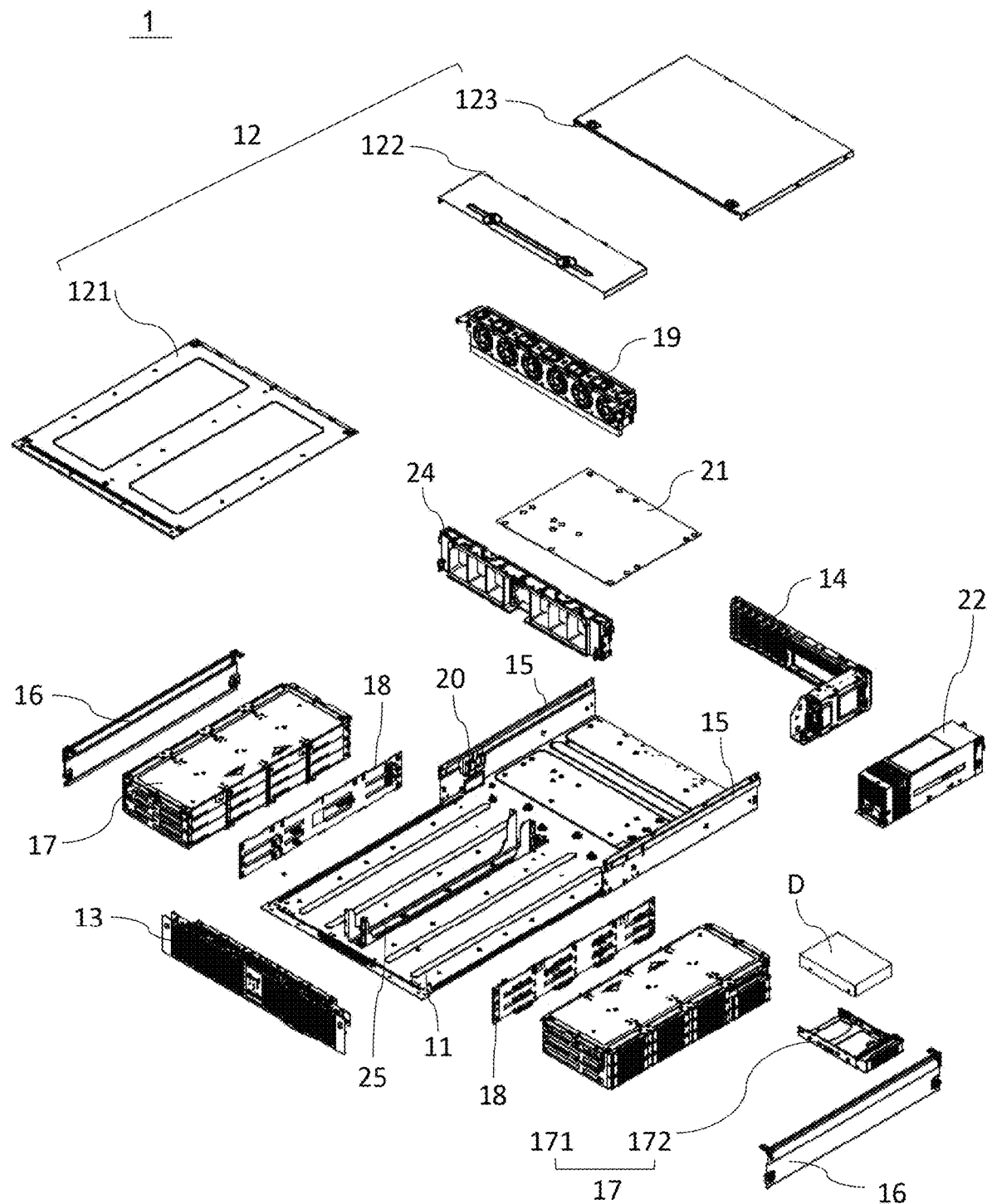
FIG. 2 illustrates an exploded view of a server system without the rack according to one embodiment of the present disclosure.
Figure 3:
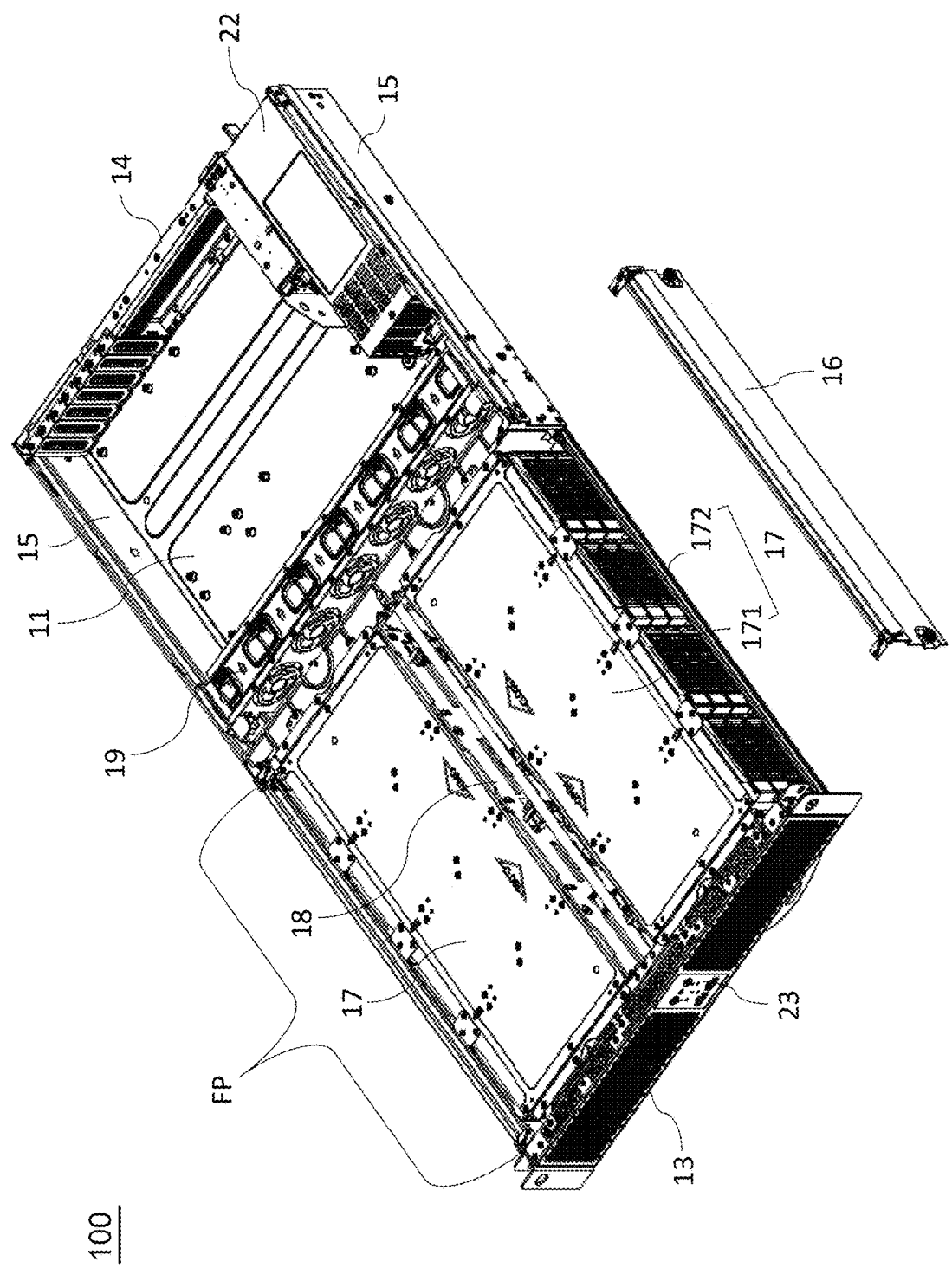
FIG. 3 illustrates an isometric view of a server system according to one embodiment of the present disclosure.

According to one embodiment of the present disclosure, FIG. 1 illustrates a server system 100 mounted to a rack 500; FIG. 2 illustrates an exploded view of the server system 100 without the rack 500; FIG. 3 illustrates the arrangements in the server system 100. Referring to FIG. 2 and FIG. 3, the server system 100 has an enclosure. The enclosure comprises a deck (base) 11, a top cover 12 disposed over the deck 11, a front panel 13 disposed between the top cover 12 and the deck 11, a back panel 14 parallel to the front panel 13, a pair of side walls 15 parallel to each other, two component housings (i.e., storage module)17, two circuit boards 18, a fan module 19, a pair of fan mounts 20, a board insulator 21, a motherboard (not shown), and a power module 22. The pair of side walls 15 are arranged to be perpendicular to the back panel 14 and the stress supporting member 24. Further, the pair of side walls 15 are arranged to be perpendicular to the front panel 13. In some embodiments, the enclosure further comprises two side doors 16 parallel to each other. The pair of side doors 16 are arranged to be perpendicular to the front panel 13 and the stress supporting member 24. Further, the pair of side doors 16 are arranged to be perpendicular to the back panel 14. Each of the pair of side doors 16 are arranged to be at a substantially straight angle with a corresponding side wall 15. In one embodiment, the deck 11 is a rectangular plate having two longer sides and two shorter sides. The front panel 13 and the back panel 14 are each arranged at one of the two shorter sides of the deck 11; the side walls 15 and the side doors 16 are arranged at the longer sides of the deck 11. Each longer side of the deck 11 has a side wall 15 proximal to the back panel 14 and a side door 16 proximal to the front panel 13. In some embodiments, the side doors 16 are mechanically attached to enclosure. In some embodiments, portions of the enclosure act as jambs to the side doors 16 where mechanical attachments are formed. In an exemplary embodiment, the side doors are hinged to the top cover 12 and configured to angle away from the enclosure. Furthermore, the side wall 15 and the side door 16 on the same side of the deck 11 are substantially aligned with each other. The side wall 15 and the side door 16 are disposed between the top cover 12 and the deck 11. The component housings 17, the circuit boards 18, the fan module 19, the board insulator 21, the motherboard, and the power module 22 are disposed on the deck 11. The component housings 17 comprises a receiving frame structure (storage case) 171, and a plurality of device docks (drive bays) 172. The device docks 172 are configured to carry a plurality of electronic devices (i.e., storage drives, storage components) D, and the storage drives D can be inserted into the receiving frame structure 171 horizontally with the device docks 172 from the front end of the component housing 17. In some embodiments, the component housing 17 is configured to receive the plurality of storage components D in a stacked array formation. In one embodiment, the device docks 172 can be integrated into the receiving frame structure 171, and thus the receiving frame structure 171 can receive the storage drives D by itself. Thus, the device docks 172 may be arranged in a stacked array formation as well. In some embodiments, the component housing 17 has a top surface and a bottom surface respectively fastened to the top cover 12 and the deck 11. In some other embodiments, the component housing 17 has a front end and a back end opposite the front end. The front end is facing outward the enclosure and the back end is facing inward the enclosure. In some embodiments, the component housing includes a main body where openings between the front end and the back end of the main body allow access between the front end and back end of the component housing. The component housings 17 are arranged between the side doors 16 in a back-to-back arrangement. Each of the component housings 17 is facing one of the side doors 16. In other words, the front end of the component housings 17 are facing outward from the longer side of the deck 11. The component housings 17 are at a distance from a periphery of the corresponding longer side of the deck 11. Since the component housings 17 are facing the side doors 16, the device docks 172 and the storage drives D cannot be removed from the receiving frame structure 171 when the side doors 16 are closed. In some embodiments, the front end of the component housing 17 is at a distance from the side door 16.

In some embodiments, the pair of circuit boards 18 are arranged between the pair of component housings 17. The pair of circuit boards 18 are at a distance from each other. Each of the circuit boards 18 is vertically arranged with respect to the deck 11 at the back end of one of the component housings 17, so the circuit boards 18 are standing behind and covering the back end of the component housings 17. In some embodiments, the circuit boards are covering the back end of the component housings by having the planar surface (i.e., side of the circuit board having the largest surface area) of the circuit board 18 arranged projectively within the periphery of the back end of the component housing 17. In some embodiments, the circuit board 18 may arranged to extend from the periphery of the back end of the component housing 17. In an exemplary embodiment, the planar surface of the circuit board 18 may be disposed over the opening at the back end of the main body of the component housing 17. In some embodiments, each of the circuit boards 18 may be arranged at an angle from the deck 11. In an exemplary embodiment, the circuit boards 18 are arranged to be substantially perpendicular to the deck 11. Further, the circuit board 18 may be abutting the back end of the component housing 17. In some embodiments, the circuit board 18 is mechanically fastened to the back end of the component housing 17. In some embodiments, the circuit boards 18 can be electrically coupled to the storage drives D in the component housings 17 without cables in between. Thus, in some embodiments, the storage drives D and the circuit boards are coupled to each other using board-to-board connectors. Further, the circuit boards 18 are configured to form electrical coupling between the storage drives D and the motherboard.

The fan module 19 is arranged between the side walls 15 and configured to cool the component housings 17 and the circuit boards 18. The pair of fan mounts 20 are arranged separately in proximity to different side walls 15, and the fan module 19 can be installed to the server system 100 by coupling to the pair of fan mounts 20. As such, the fan module 19 sits across the deck 11 in a side-to-side direction in the server system 100. The motherboard is arranged on the board insulator 21 between the fan module 19 and the back panel 14, and the motherboard is electrically coupled to the circuit boards 18, the fan module 19, and the power module 22. The power module 22 is arranged between the side walls 15 closer to the back panel 14 than the fan module 19, and the back of the power module 22 is aligned with the back panel 14, and thus the back panel 14 does not cover the back of the power module 22 as such. Therefore, the power module 22 can be removed from the server system 100 independently. The top cover 12 is disposed above the deck 11 over the component housings 17, the circuit boards 18, the fan module 19, the motherboard, and the power module 22. Therefore, the deck 11, the top cover 12, the front panel 13, the back panel 14, the side walls 15, the doors 16, and the power module 22 together form an enclosure accommodating the component housings 17, the circuit boards 18, the fan module 19, the fan mounts 20, the board insulator 21, and the motherboard.

In one embodiment of the present disclosure, the top cover 12 comprises a storage cover 121 covering over the component housings 17 and the circuit boards 18, a fan cover 122 covering over the fan module 19, and a motherboard cover 123 covering over the motherboard. Therefore, the component housings 17 with the circuit boards 18, the fan module 19, and the motherboard can be accessed individually from the top of the server system 100 for maintenance by removing corresponding portion of the top cover 12.

Figure 4:
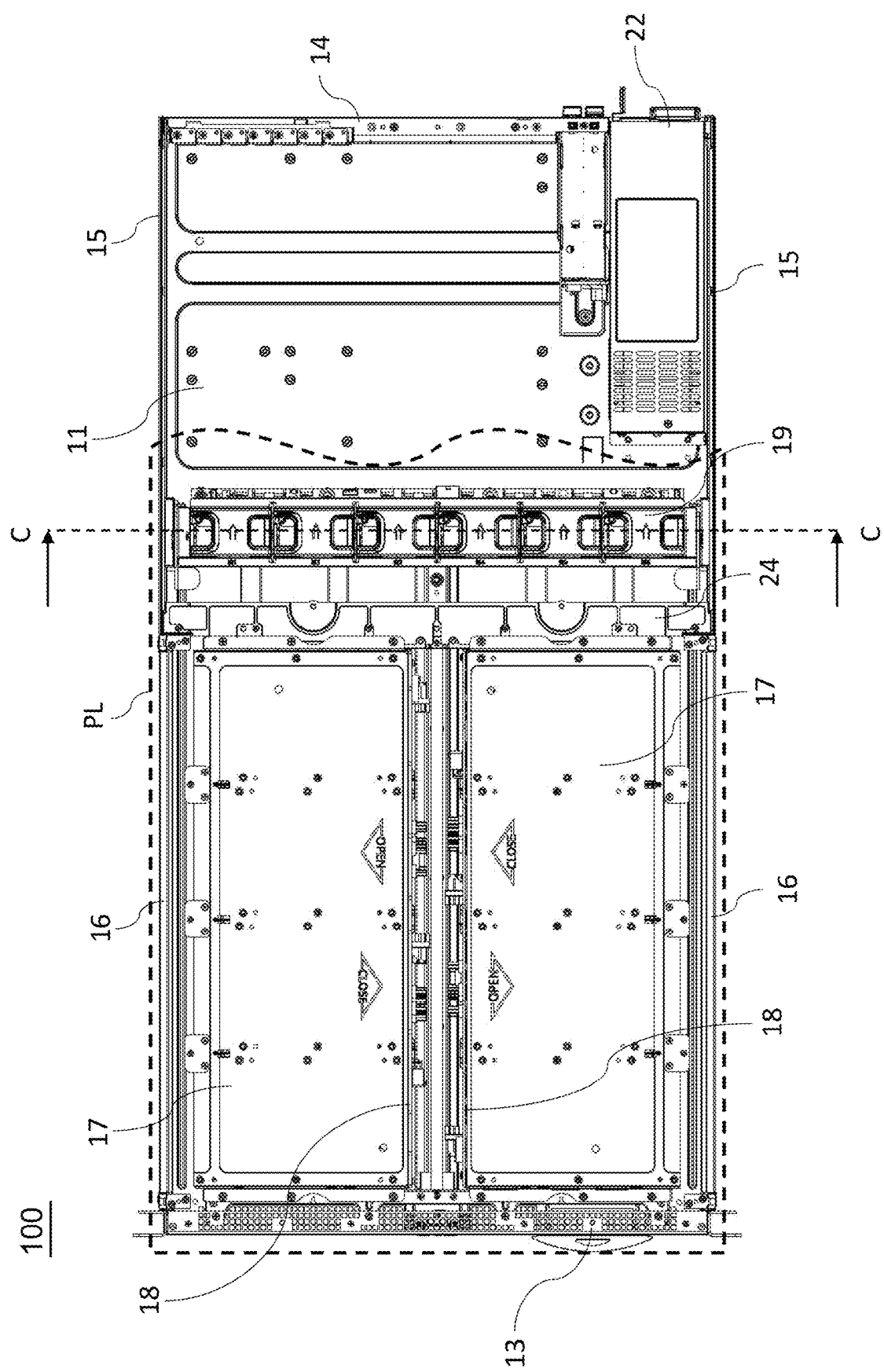
FIG. 4 is a top view of FIG. 3 according to one embodiment of the present disclosure.
Figure 5:
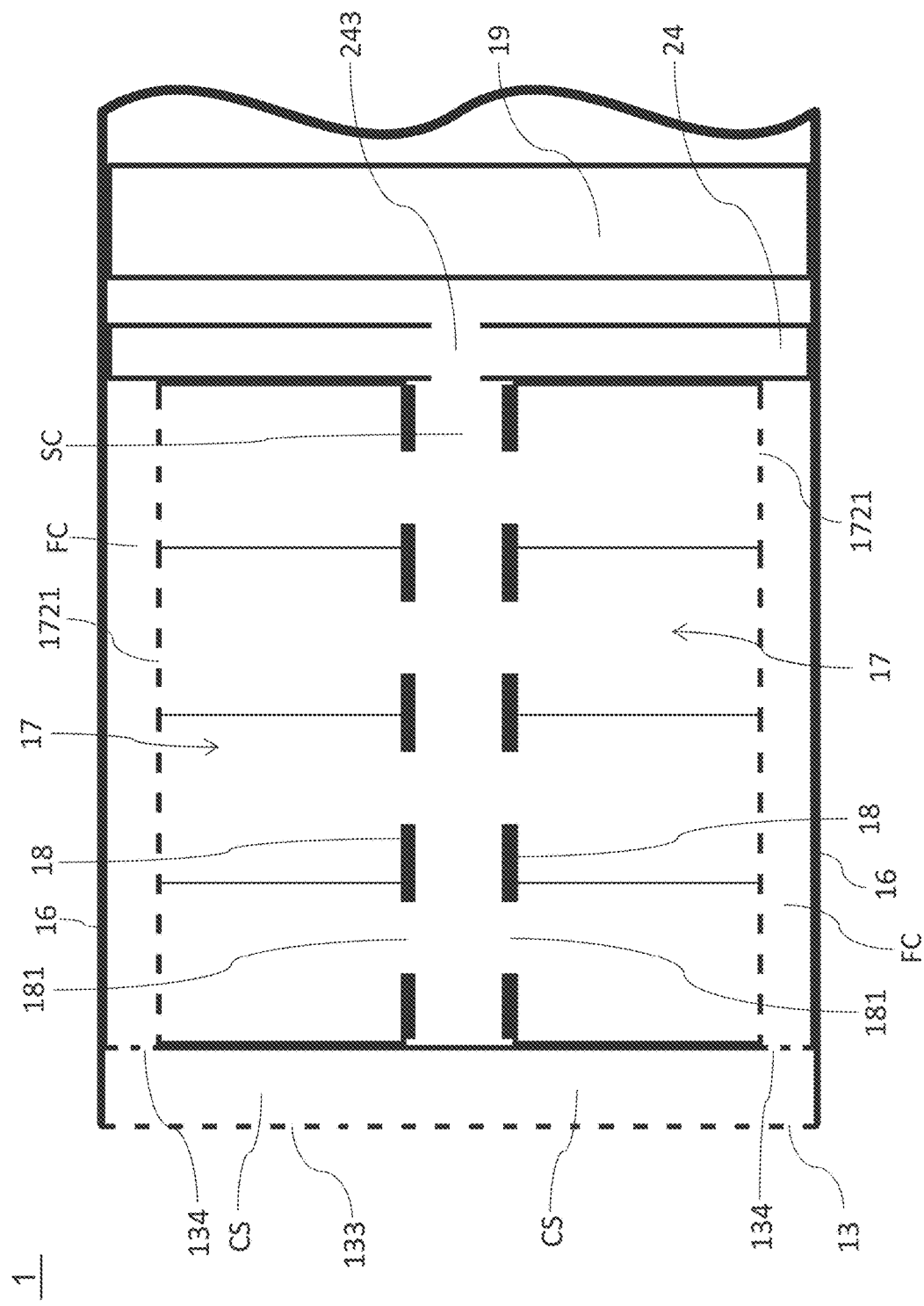
FIG. 5 is a simplified partial layout PL of FIG. 4 according to one embodiment of the present disclosure.

FIG. 4 is a top view of FIG. 3 and FIG. 5 is a simplified partial layout PL of FIG. 4 according to one embodiment of the present disclosure. Referring to FIG. 4 and FIG. 5, a cooling arrangement of the server system 100 in accordance to an embodiment of the instant disclosure (e.g., for the component housings 17 and the circuit boards 18 thereof) will be described below.

To cool the server system 100, the fan module 19 is configured to draw air into the server system 100 from the front panel 13 and blow air out of the server system 100 at the back panel 14. Between the front panel 13 and the back panel 14, the air driven by the fan module 19 flows through and cool the component housings 17 and the circuit boards 18. More specifically, as shown in FIG. 5, the air flows into a collecting space CS in the front panel 13 through multiple air inlets 133 of the front panel 13, and then the air exits the front panel 13 through multiple air outlets 134 at the sides of the collecting space CS. And then, the air flows into two periphery corridors (first corridors) FC between the front panel 13 and the component housings 17. In some embodiments, the periphery corridor FC is defined by a lateral separation between the front end of the component housing 17, one of the side door 16, and a portion of a stress distributing member 24. The periphery corridor FC is further defined by the vertical separation between the deck 11 and the top cover 12. In other words, a flow path is defined by an enclosure formed using the front end of the component housing 17, the side door 16, a portion of a stress distributing member 24, the deck 11, and the top cover 12. As shown in FIG. 5, the portion of the stress distributing member 24 arranged between side doors 16 and the component housing 17 form a seal for the periphery corridor FC. Further, the stress distributing member 24 forms a barrier between a front section and a rear section of the deck 11. The front section is further defined by a space between the pair of side doors 16. The rear section is further defined by a space between the pair of side walls 15. The pair of periphery corridors FC refer to the space situated inside the doors 16 and in front of the component housings 17 as shown in FIG. 5, so each of the two periphery corridors FC is defined between one of the doors 16 and one of the component housings 17 facing the door 16. The server system 100 further comprises a stress distributing member (first support) 24 arranged at the end of the periphery corridor FC and on a side closer to the back panel 14 of the component housings 17, and the stress distributing member 24 acting as an air stopper is configured to stop the air in the periphery corridor FC from flowing toward the fan module 19 without passing through the component housings 17 and the circuit boards 18. In some embodiments, the air flowing though the periphery corridor FC is exhausted by the fan module 19 to enter the component housing 17 through the front end and exit the component housing 17 through the plurality of slits 181 of the circuit boards 18. The stress distributing member 24 traverses the entire width of the deck 11. In some embodiments, the stress distributing member 24 is fastened to the deck 11 and the top cover 12. The stress distributing member 24 and the component housing 17 are arranged to abut each other. In one embodiment, the server system 100 can comprise other types of air stoppers disposed at the end of the two periphery corridors FC instead of or in addition to the stress distributing member 24, for example, airtight sealant, airtight foam, airtight tape, etc. As a result, the air flows from the two periphery corridors FC into the component housings 17 through multiple air holes 1721 at the front end, and then the air leaves the component housing 17 from the multiple slits 181 on the circuit boards 18. As such, the air enters a central corridor (second corridor) SC which is a space defined between the circuit boards 18. As the fan module 19 continues drawing, the air from the central corridor SC is driven through an opening 243 of the stress distributing member 24 between the central corridor SC and the fan module 19. The opening 243 may be formed by a perforation on the stress distributing member 24 aligned with the central corridor SC. In the end, the air passes through the fan module 19 and leaves the server system 100 from the back panel 14. The two periphery corridors FC are parallel to the central corridor SC, whereas the collecting space CS is perpendicular to the central corridor SC. It should be noted that, the collecting space CS in the front panel 13 should not be in direct communication with the central corridor SC between the component housings 17.

FIG. 26A-26E illustrates a boning structure according to one embodiment of the present disclosure. In some embodiments, the enclosure is divided into a front section and a rear section. A boning structure of the enclosure is configured to provide structural support to the enclosure when experiencing load force. In some embodiments, the boning structure includes the stress distributing member 24, the side walls 15 fastened to the ends of the stress distributing member 24, and a spine 25 disposed between the deck 11 and the stress distributing member 24. The spine 25 may be disposed substantially equidistantly to the pair of side walls 15. In some embodiments, the stress distributing member 24 further includes a holding bracket 246 configured to hold down the spine 25 when experiencing load force. The holding bracket 246 forming an arch in the bottom part of the stress distributing member 24.

In addition to the stress distributing member 24 being arranged to define a rear section of the enclosure from the front section, the stress distributing member 24 may be used as a structural beam capable of withstanding load. In some embodiments, a server rack is configured to receive a plurality of enclosure. When a user need to access the enclosure, the user may pull the enclosure partially away from the server rack. In this way, a portion of the enclosure is without support from the rack. When in use, the enclosure may be partially hanging out of the server rack and may be without support for the front section. The stress distributing member is configured form a cantilever for the enclosure when a portion (i.e. front section) of the enclosure is hanging. The front section of the enclosure is defined by an area between the front panel 13 and the stress distributing member 24. In some embodiments, the component housings 17 are arranged in the front section of the enclosure. In this way, the center of gravity of the enclosure is positioned in the front section. In some embodiments, the stress distributing member 24 extends beyond the component housings 17. In some embodiments, ends of the stress distributing member 24 extending beyond the front end of the component housings act as air stoppers in the periphery corridor FC.

In some embodiments, the spine 25 may form a channel having a web 251 and flanges 252 protruding from sides of the web 251. In some embodiments, the web 251 traverses across the whole length of front section and extending partially into the rear section. Further, the web 251 is fastened to the deck 11. In some other embodiment, depending on the material of the spine, the web 251 may extent partially into the front section and the rear section. In some embodiments, the flanges 252 are extending towards the direction of the top cover 12. In some embodiments, the flanges 252 are mechanically fastened to the stress distributing member 24. Further, the ends of the flanges form L-channels 253. In some embodiments, the L-channel may be a structure where a pair of planar structures are arranged to form an L shaped cross section. In some embodiments, the angle between the planar structures may be perpendicular to each other. In some other embodiments, the angle between the planar structures may be less than 180 degrees. In an exemplary embodiment, the flanges 252 are mechanically fastened to a side of the stress distributing member 24 facing the front section. In particular, a portion of the L-channel 253 disposed parallel to a surface of the stress distributing member 24 are fastened to the stress distributing member 24 using a fastener 254. Further, in some embodiments, the flanges 251 are mechanically fastened to the front panel 13. In an exemplary embodiment, the flanges are mechanically fastened to the internal frame 132 of front panel 13. In particular, a portion of the L-channel 253 disposed parallel to a internal frame 132 are fastened to the stress distributing member 24 using a fastener 254.

Referring across the width of the stress distributing member 24, when a weight load of the storage devices is applied to the front section of the enclosure, the spine 25 may present a load force to the stress distributing member 24 and the side walls 15 may each present support reaction force to the ends of the stress distributing member 24. Referring across the length of the enclosure, when a weight load of the storage devices D is applied to the front section of the enclosure, the stress distributing member 24 and the spine 25 may form a cantilever structure. In an exemplary embodiment, when the storage devices D are equally divided between the pair of component housings 17, the storage devices D may exert substantially constant loading on the length of the spine disposed across the front section.

Furthermore, the side walls 15 are arranged on the rear section of the enclosure. The side walls 15 of the enclosure are abutting the ends of the stress distributing member. In some embodiments, the side walls 15, the deck 11, and the top cover 12 are fastened to the stress distributing member 24. In this way, the structural integrity of the enclosure is supported by the stress distributing member 24 and, further, by the spine 25. When a force is applied to any of the side walls 15, the deck 11, and the top cover 12, the stress distributing member 24 may absorb at least a portion of the stress generated on the enclosure by the force applied.

Figure 27B:
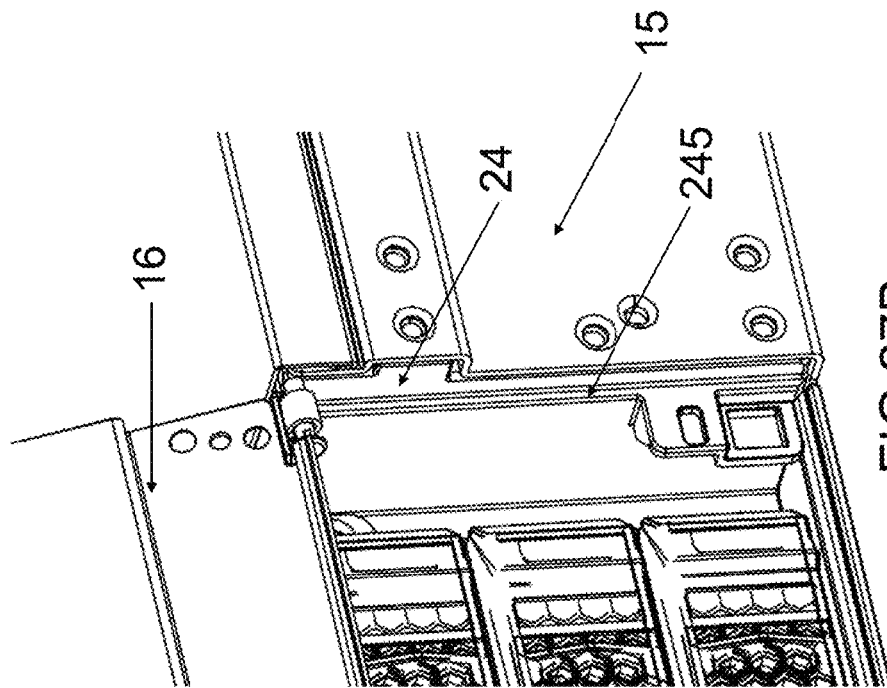
FIG. 27A-27B illustrates a side door structure according to one embodiment of the present disclosure.
Figure 27A:
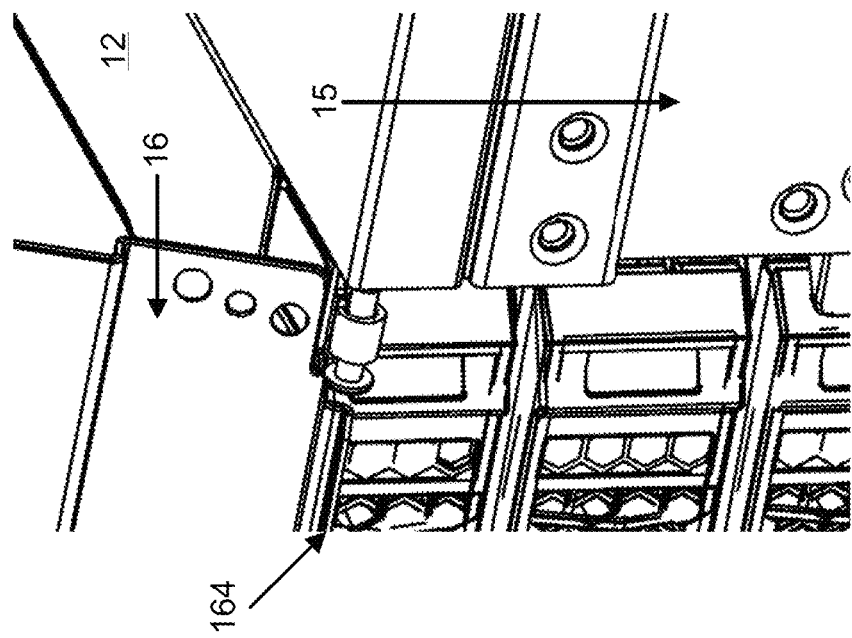
Figure 29:
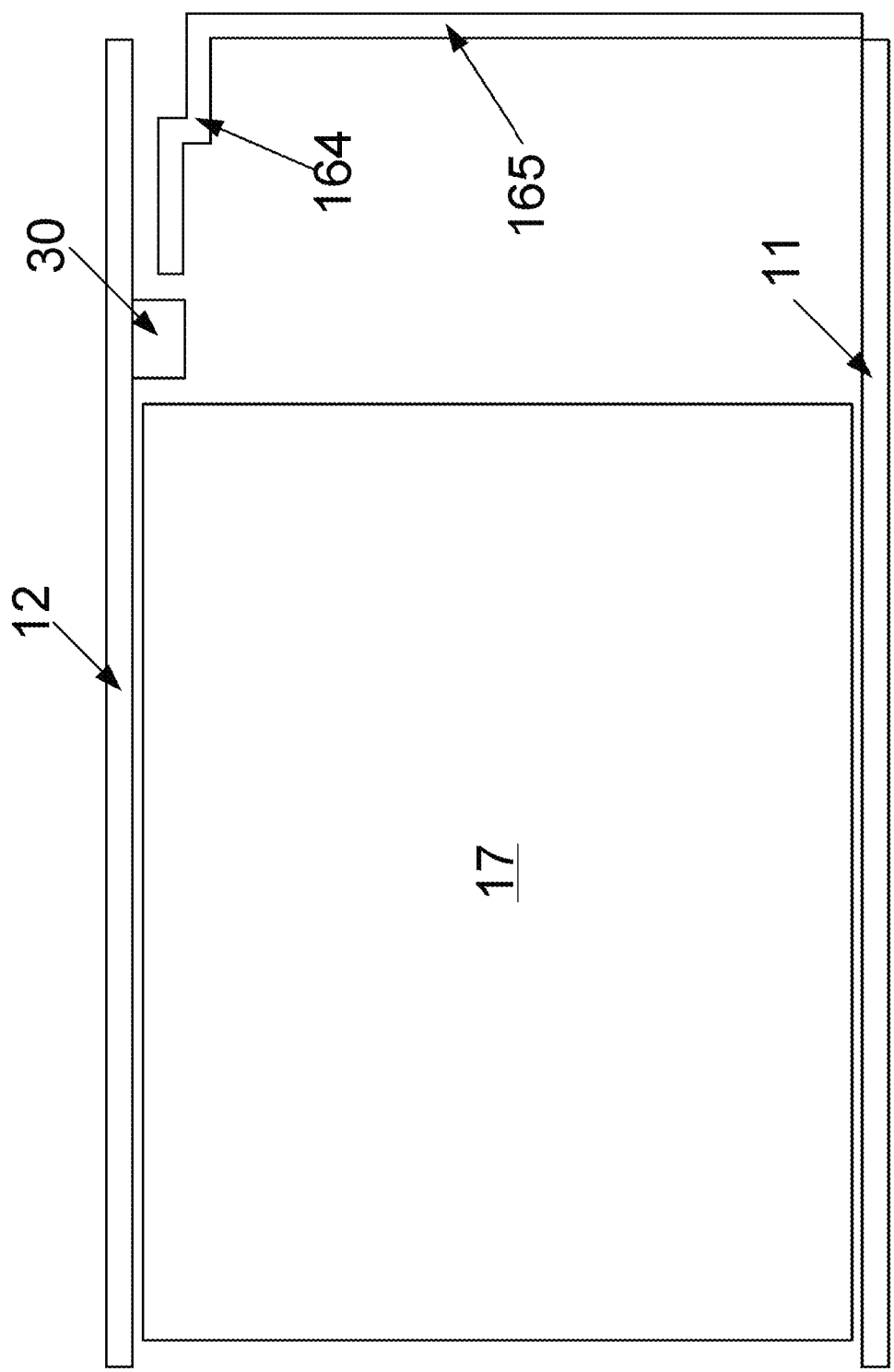
FIG. 29 illustrates a cross sectional view of a side door structure according to one embodiment of the present disclosure.

FIG. 27A-27B illustrates a side door structure according to one embodiment of the present disclosure. In further embodiments, a seal strip 30 (as shown in FIG. 29) is disposed between the side door 16 and the jamb to the side door 16 on the enclosure. The seal strip 30 is configured to prevent air from entering the side door 16. In some embodiment, the seal strip 30 may be used as a barrier for the space between the jamb of the side door 16 and the side door 16. In an exemplary embodiment, the jamb of the side door 16 is a portion of the top cover 12. The seal strip 30 (as shown in FIG. 29) is disposed between the deck 11 and the top cover 12. The seal strip 30 is disposed between the side door 16 and the top cover 12, where the seal strip 30 is attached to an inner surface of the top cover 12. The seal strip 30 is configured to prevent air from entering through a space between the side door and the top cover.

FIG. 29 illustrates a cross sectional view of a side door structure according to one embodiment of the present disclosure. In some embodiments, the side door 16 (as shown in FIGS. 27A-27B) includes a door panel 165 and a sealing flange 164 formed at an angle from the door panel 165. In some embodiments, the sealing flange 164 is perpendicular to the door panel 165. In some other embodiments, an angle between the sealing flange 164 and the door panel 165 may be greater, or less, than 90 degrees. When the angle between the sealing flange 164 and the door panel 165 is greater than 90 degrees, the sealing flange 164 may form a barrier for a gap between the door panel 165 and the top cover 12.

Figure 8:
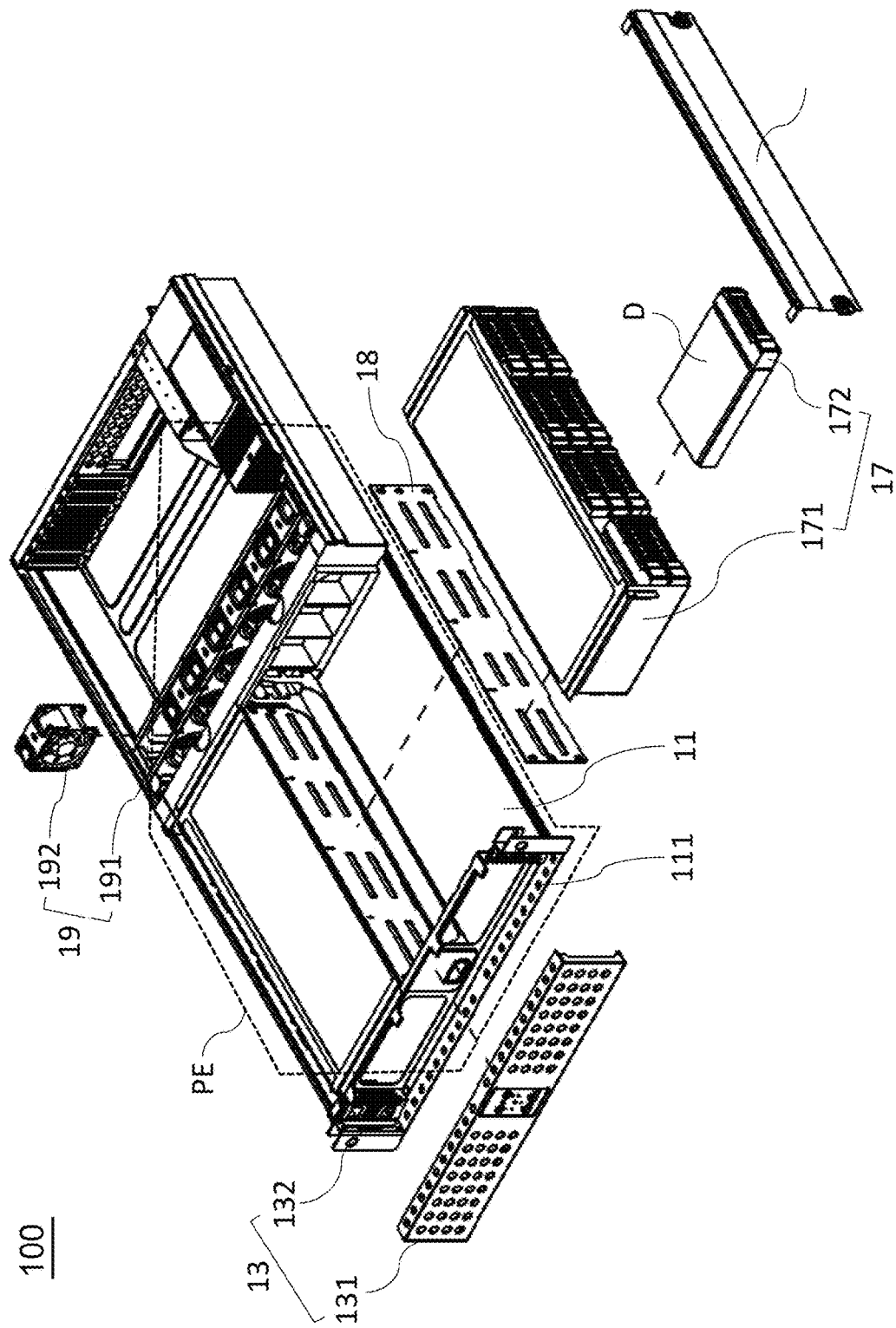
FIG. 8 illustrates another exploded view of a server system according to one embodiment of the present disclosure.
Figure 9:
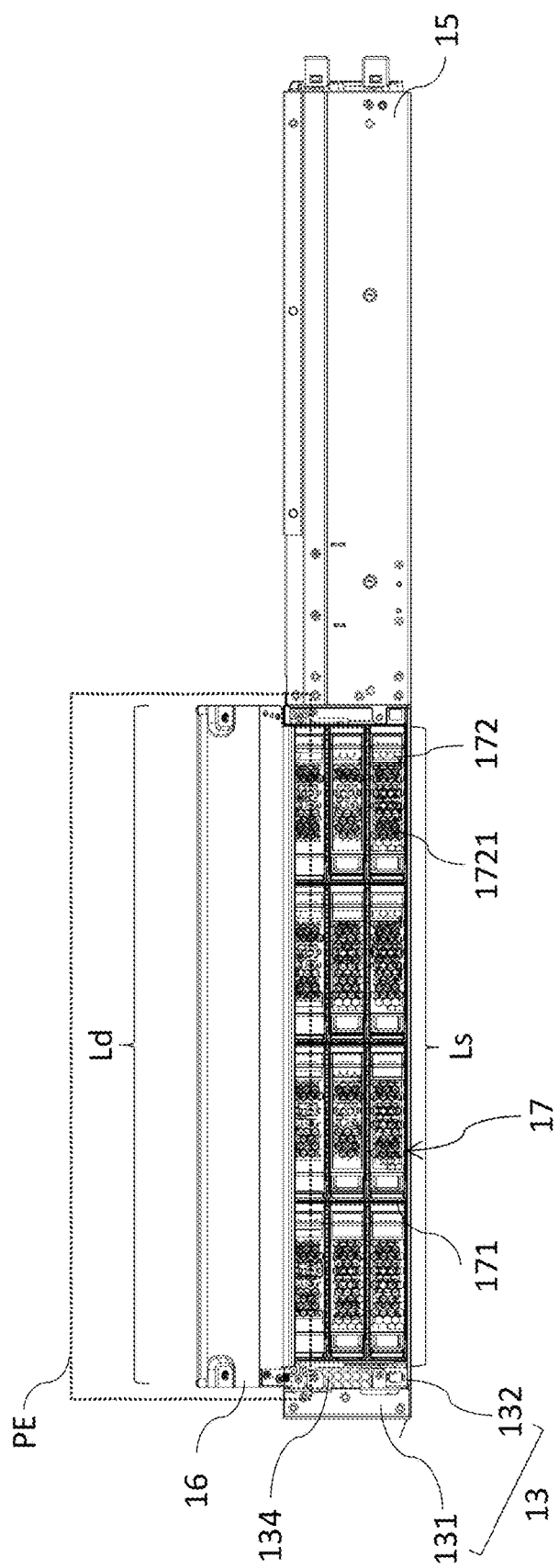
FIG. 9 illustrates a side view of a server system according to one embodiment of the present disclosure.

The door panel 165 is configured to angle away from a corresponding side wall 15 (as shown in FIGS. 27A-27B). In other words, when the side door 16 is opened and/or moved away from the enclosure, an angle between the side wall 15 and the side door 16 may increase. The sealing flange 164 is configured to angle away from the top cover 12. In other words, when the side door 16 is opened and or moved away from the enclosure, an angle between the sealing flange 164 and an inner surface of the top cover 12 may increase. Further, when the side door 16 is opened, the front end of the component housing 17(as shown in FIGS. 8-9) may be exposed and the user may gain access to the electronic components stored within the component housing 17.

In some embodiments, when the side door 16 is closed, the sealing flange 164 forms a barrier between the outside environment and the periphery corridor. Although the sealing flange 164 may not be directly touching the top cover 12 or the seal strip 30, the air flow from outside environment may still be prevented from entering the periphery corridor and the air flow within the periphery corridor may be prevented from leaking out of the enclosure. Further, when the side door 16 is closed, depending on the mechanism used, the side doors may be at rest. In other words, the side door 16 may be covering the front end of the component housing 17 when no force (e.g., pulling force) is applied to the side door 16.

In some embodiments, when the seal strip 30 is attached to the inner surface of the top cover 12 and is disposed adjacent to the side door 16, the thickness of the seal strip 30 is no less than a distance between the top cover 12 and the sealing flange 164 when the side door 16 is closed. In some other embodiments, when the door is closed, the sealing flange 164 and the seal strip 30 may be substantially abutting each other.

In some other embodiments, the periphery of the top cover 12 arranged above the side doors 16 may be folded. Thus, the thickness of the seal strip 30 may further have additional thickness of the top cover 12 and the thickness that is no less than a distance between the top cover 12 and the sealing flange 164 when the side door 16 is closed.

In some other embodiments, the thickness of the seal strip 30 is less than a distance between the inner surface of the top cover 12 and the top row of device docks 172. In some such embodiments, when the top row of device docks 172 are removed from the enclosure, the seal strip 30 may not impede on the path of the device docks 172. In some other embodiments, the thickness of the seal strip 30 is less than a distance between the inner surface of the top cover 12 and the top row of storage drives D (as shown, e.g., in FIG. 2). Consequently, when the top row of storage drives D is removed from the enclosure, the seal strip 30 may not impede on the path of the storage drives D.

In some embodiments, the stress distributing member 24 may include a pair of door stops 245 protruding from areas of the stress distributing member 24 arranged between the side doors 16 and the component housings 17. The door stops 245 are configured to seal a gap between the side doors 16 and the side walls 15.

Figure 6:
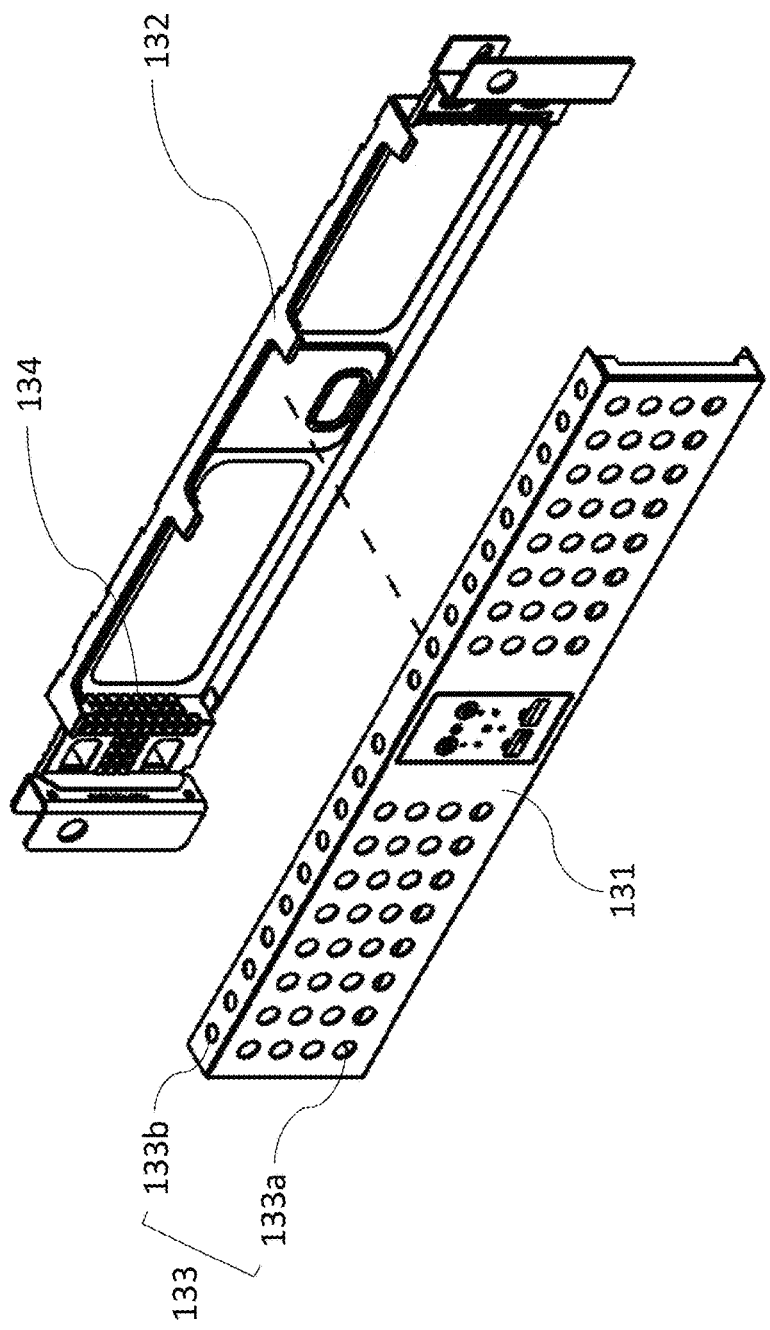
FIG. 6 illustrates an exploded view of a front panel according to one embodiment of the present disclosure.

FIG. 6 illustrates the front panel 13 being disassembled according to one embodiment of the present disclosure. The front panel 13 comprises an external frame 131, and an internal frame 132 opposite the external frame 131. Multiple air inlets 133 are formed on the external frame 131 through perforations. Multiple air outlets 134 are formed on the internal frame 132 through perforations. The front panel 13 can be installed to the server system 100 by coupling the internal frame 132 between the side of component housings 17 and the deck 11. In other words, the component housings abut the internal frame. In some other embodiments, the component housing is further arranged to be fastened to the front panel 13. And, the external frame 131 is coupled to the internal frame 132 to form the collecting space CS. In some embodiments, the collecting space CS is formed between the external frame 131 and the internal frame 132. In some embodiments, the collecting space CS is arranged to collect particles from outside environment. However, the use of the collecting space CS is not limited thereto. The multiple air inlets 133 are arranged on the external frame 131. In addition, the multiple air inlets 133 comprise a major air inlet 133a arranged at the front of the front panel 13 and a minor air inlet 133b arranged at the top and/or at the bottom (not shown) of the front panel 13. In other words, the major air inlet 133a and the minor air inlet 133b are arranged at different faces of the front panel 13. The multiple air outlets 134 are arranged to the sides of the internal frame 132, and thus corresponding to the two periphery corridors FC in position. In some embodiments, the perforations (i.e., multiple air outlets 134) on the internal frame 132 are formed in an area projectively across the extending part of the stress distributing member 24. In particular, the multiple air outlets 134 are formed in an area of the internal frame 132 arranged between the front end of the component housing and the side door. In some embodiments, the area of perforation of the external frame is greater than an area of perforation of the internal frame. In comparison, the total area of the multiple air inlets 133 is larger than the total area of the multiple air outlets 134, as such compressing the air and increasing the flowrate around the multiple air outlets 134.

Figure 7:
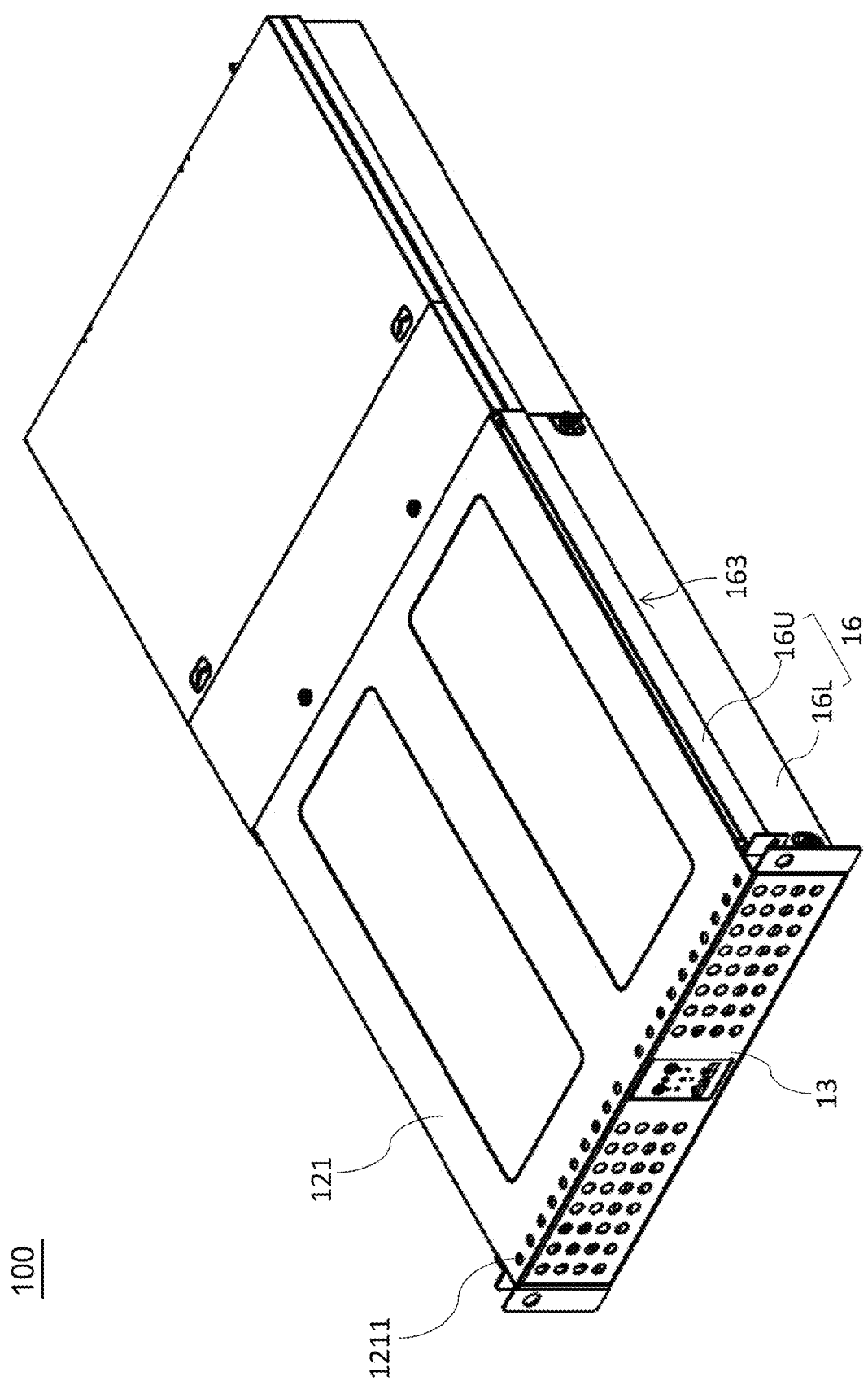
FIG. 7 illustrates another isometric view of a server system according to one embodiment of the present disclosure.

In one embodiment of the present disclosure, FIG. 7 shows the storage cover 121 comprising a cover punch 1211 if the minor air inlet 133b is arranged at the top of the front panel 13, and the cover punch 1211 is corresponding to the minor air inlet 133b in position. Therefore, the air can be drawn through the cover punch 1211 of the storage cover 121 that leads into the collecting space CS of the front panel 13. In another embodiment of the present disclosure, FIG. 8 shows the deck 11 comprising a deck punch 111 if the minor air inlet 133b is arranged at the bottom of the front panel 13, and the deck punch 111 is corresponding to the minor air inlet 133b in position. Therefore, the air can be drawn through the deck punch 111 of the deck 11 that leads into the collecting space CS of the front panel 13. Back to FIG. 7, in one embodiment of the present disclosure, each of the doors 16 comprises a stepped structure 163 which divides the door 16 into an upper portion 16U and a lower portion 16L, and the lower portion 16L is dented into the server system 100 with respect to the upper portion 16U. Therefore, the doors 16 are configured to receive racking rails 600 beneath the stepped structures 163 when the server system 100 is completely within the rack 500 as shown in FIG. 1, such that the overall weight of the server system 100 can be evenly distributed between the front panel 13 and the back panel 14 without fixing the racking rails 600 to the doors 16.

FIG. 9 is a side view of the server system 100 with the door 16 opened according to one embodiment of the present disclosure. The server system 100 depicted in FIG. 9 is a 2U rack mount server unit, and each receiving frame structure 171 of the two component housings 17 is configured to carry twelve device docks 172, hence twelve storage drives D as shown. Therefore, the server system 100 with two component housings 17 is configured to load twelve storage drives D on each side, and twenty-four storage drives D in total as such. In an exemplary, the enclosure may be able to twenty-four storage drives D, each weighing around 630 grams. In some embodiments, the enclosure is able to support around 15 kg worth of electronic device weight inserted into the enclosure. In particular, the boning structure of the enclosure allows the enclosure to support 15 kg worth of load while hanging from the server rack. Further, in some other embodiments, the boning structure of the enclosure allows the enclosure to support more than 15 kg worth of load in the front section while hanging from the server rack. Of which, other load source other than storage devices may be included. In some other embodiments, the enclosure may be able to support hanging load greater than 15 kg (i.e. front section having a load weight around 21 kg. However, the embodiments are not limited thereto. In some embodiments, the loading limit of the enclosure may be changed according to the size and material of the enclosure. The multiple air inlets 1721 are arranged at the front of the device docks 172 in the component housings 17. Since both the air outlets 134 and the air holes 1721 are in communication with the periphery corridors FC, and thus allowing the air drawn by the fan module 19 flows from the collecting space CS into the device docks 172. The length Ld of the doors 16 is equal to or longer than the length Ls of the component housings 17, that not only shields the component housings 17 from dust, but also ensures the periphery corridors FC defined inside the doors 16 communicating all the air holes 1721 when the doors 16 are closed, such that all the air from the multiple air outlets 134 can flow into the component housing 17. Since the doors 16 should be longer than the component housings 17, the side walls 15 is not overlapped with the component housings 17. Though the length Ls of the component housing 17 is equal to the length of the receiving frame structure 171 in this embodiment. In another embodiment where a receiving frame structure 171 is not provided, the length Ls can represent an overall length of a plurality of storage drives D that is mounted to the server system 100 on one side.

Figure 11:
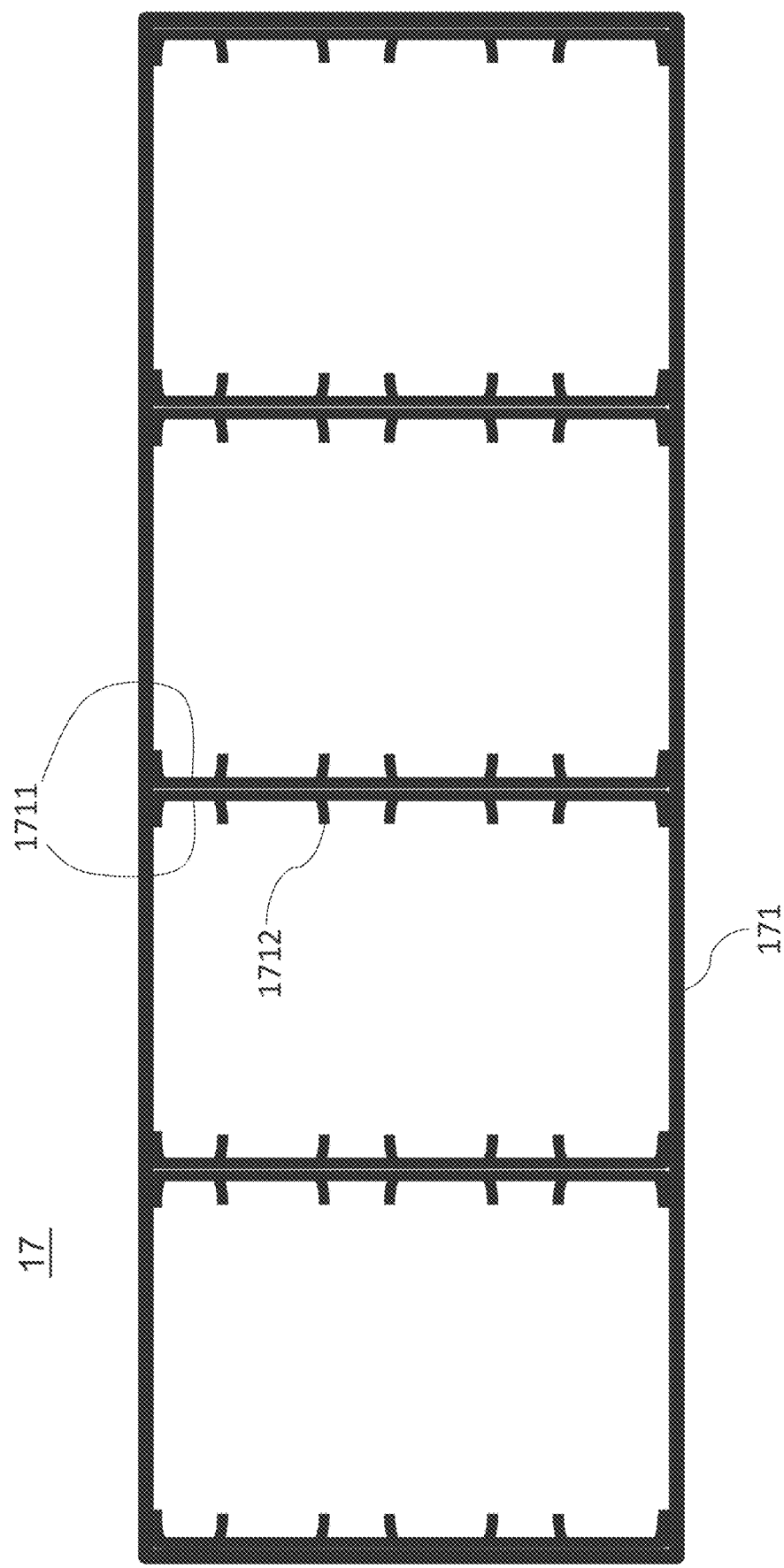
FIG. 11 illustrates a front view of a receiving frame structure according to one embodiment of the present disclosure.

According to one embodiment of the present disclosure, FIG. 10 illustrates one of the component housings 17 with a circuit board 18 behind; FIG. 10-1 illustrates a A-A cross-sectional view of FIG. 10; FIG. 11 illustrates one of the receiving frame structures 171. As shown in FIG. 10, the twelve storage drives D in the receiving frame structure 171 are arranged horizontally in a three (rows) by four (columns) arrangement. Referring to FIG. 11, the receiving frame structure 171 comprises three column partitions 1711 and a plurality of row rails 1712, and each column partition 1711 has a double layered structure with the plurality of row rails 1712 integrated thereon. Back to FIG. 10-1, as the air drawn from the periphery corridors FC entering the component housings 17 via the air holes 1721 on the device docks 172, the air passes passages P next to the storage drives D. In one embodiment, the passages P are defined by spaces above the top of the storage drives D. When the air travels through the passages P, the air is in direct contact with the storage drives D, and thus taking heat away mostly from top of the storage drives D. After passing through the passages P, the air leaves the component housings 17 and enters the central corridor SC via slits 181 on the circuit boards 18 which are behind the component housings 17.

Figure 28:
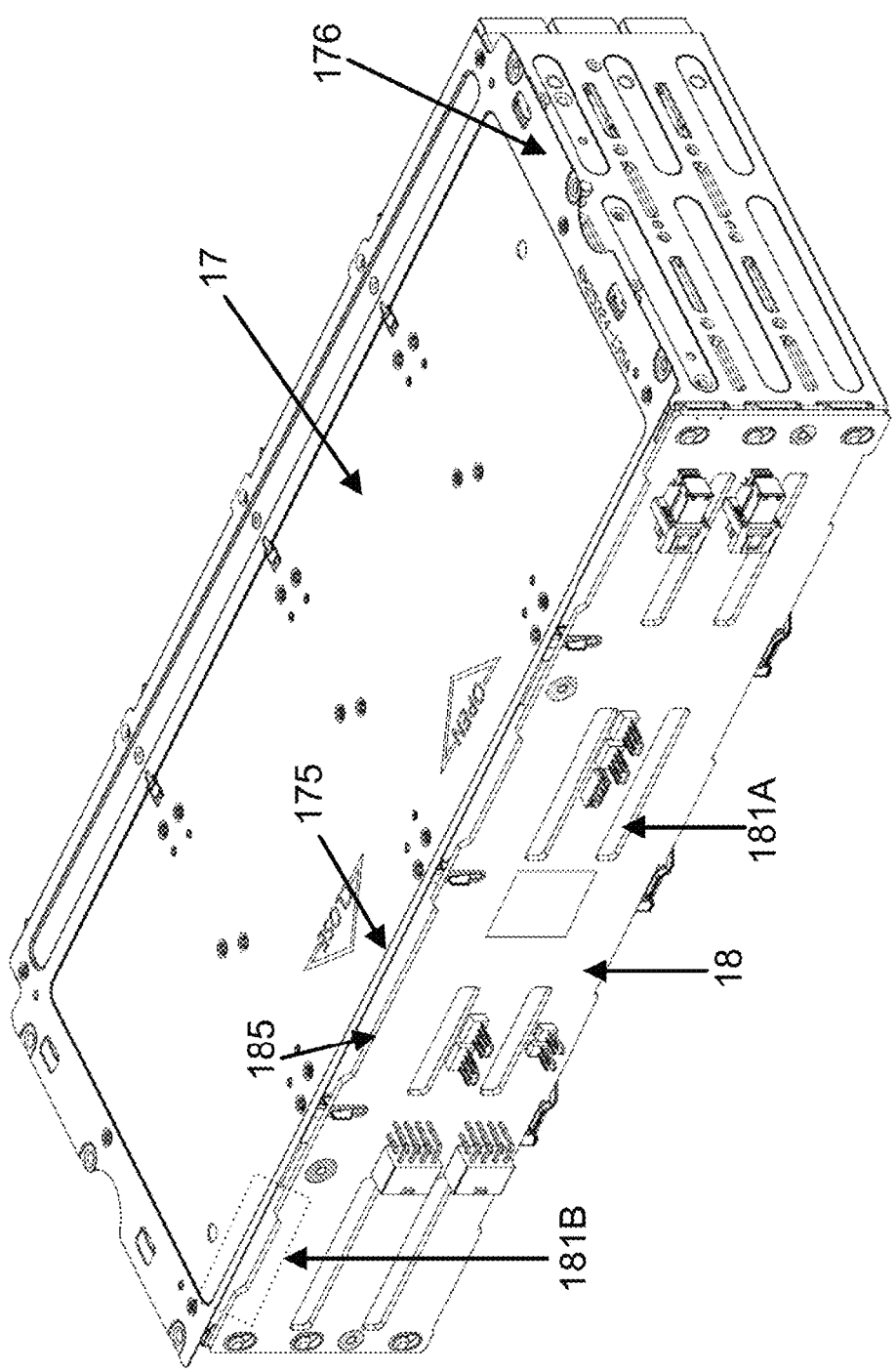
FIG. 28 illustrates a storage module according to one embodiment of the present disclosure.

FIG. 28 illustrates a storage module according to one embodiment of the present disclosure. The storage module may be formed by the component housing 17 and the circuit board 18. In some embodiments, the circuit boards 18 are perforated to form a plurality of slits 181. The plurality of slits 181A may be formed on the planar profile of the circuit boards 18. In some embodiments, the plurality of slits are in an array 181A formation. When the circuit board 18 is covering the back end of the component housing 17, the plurality of slits 181 may be arranged to expose the back ends of the storage components. In some embodiments, the plurality of slits 181B are further formed by the circuit board 18 in combination with the component housing 17. In an exemplary embodiment, a portion of the slits 181B are formed by a notch 185 on the periphery of the circuit board 18 and a corresponding peripheral side 175 on the back end the component housing 17. In an exemplary embodiment, the number of the plurality slits 181 of the circuit board 18 is the same as the number of storage components that can be carried by the component housing 17. Further, a number of slits may be further formed by the bottom area of the circuit board and the component housing. However, the number of the plurality slits is not limited thereto. In some embodiments, the number of the plurality slits may be greater than or less than the number of storage components that can be carried by the component housing depending on the arrangement of the slits in the circuit boards.

In some other embodiments, the component housing 17 further comprises flanges 176 extending from the sides of the component housing 17. In some embodiments, the flanges 176 can correspondingly overlap the front panel 13 and the stress distributing member 24. Further, the flanges 176 can correspondingly fastened top surface of the front panel 13 and top surface of the stress distributing member 24.

Figure 12:
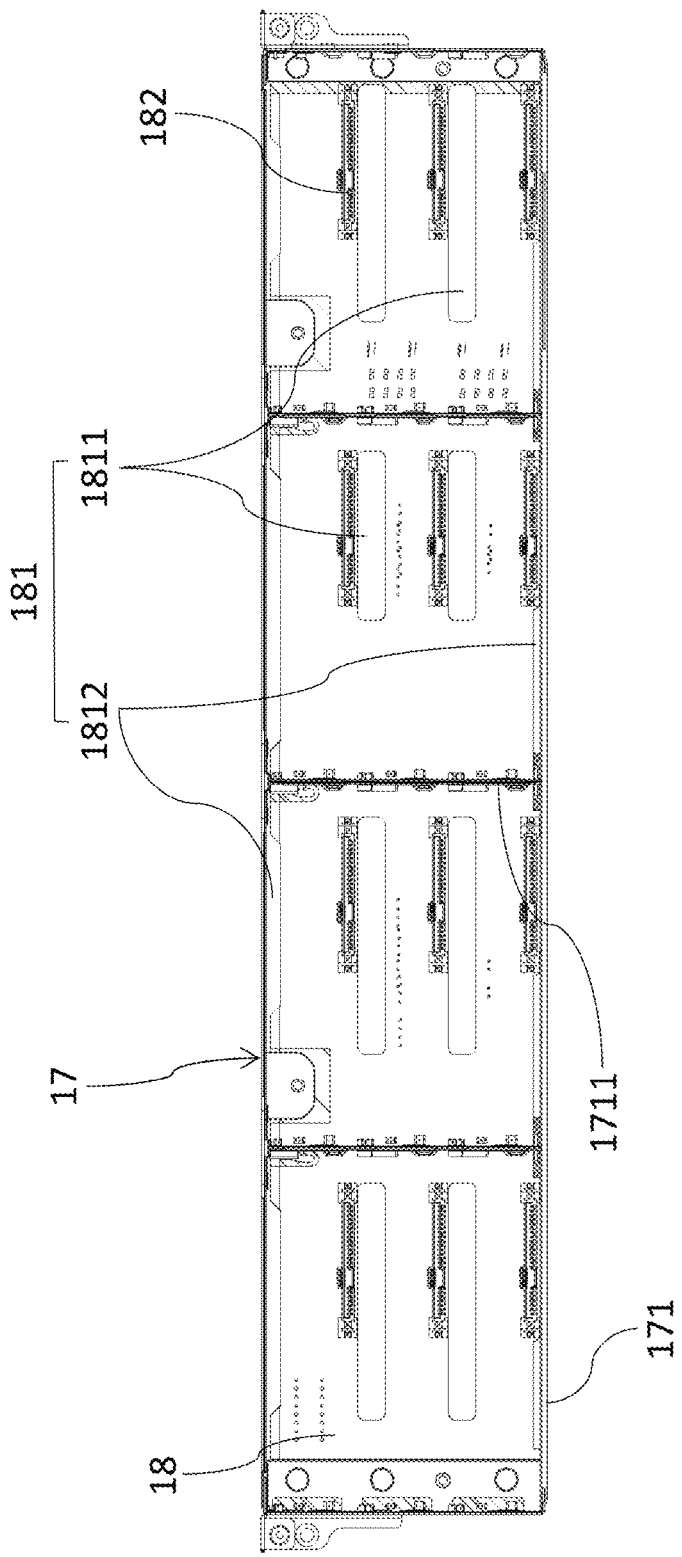
FIG. 12 illustrates a same point of view as that shown in FIG. 10 without showing the device docks and the storage drives, according to one embodiment of the present disclosure.

According to one embodiment of the present disclosure, FIG. 12 illustrates FIG. 10 without showing the device docks 172 and the storage drives D. As depicted by FIG. 12, when all the device docks 172 and the storage drives D are removed from the receiving frame structure 171 of a component housing 17, the circuit board 18 arranged behind the component housing 17 can be seen from the front thereof. In other words, the receiving frame structure 171 is a box with its front being empty and back being the circuit board 18. In one embodiment, one circuit board 18 comprises multiple columns of slits 181, and the number of columns of slits 181 is corresponding to the number of columns of storage drives D. In other words, each column of device docks 172 with storage drives D therein can have a column of slits 181 therebehind. Therefore, air passing through the passages P of the component housings 17 can flow into the central corridor SC effectively without converging horizontally. In one embodiment of the present disclosure, the slits 181 comprise at least a major slit 1811 and a minor slit 1812. As depicted in FIG. 12, the major slits 1811 are arranged at non-edge portion of the circuit board 18, whereas the minor slits 1812 are arranged at edge portion of the circuit board 18. In other words, the major slits 1811 are holes on the circuit board 18, and the minor slits 1811 are notches at the edge of the circuit board 18. In one embodiment of the present disclosure, the circuit board 18 comprises at least a minor slit 1812 at its top edge. In another embodiment, the circuit board 18 comprises minor slits 1812 at both top edge and bottom edge thereof. In yet another embodiment, the circuit board 18 further comprises a plurality of drive connectors 182 configured to couple to the storage drives D. Since the drive connectors 182 is one of the major components that retains heat, each of the drive connectors 182 is arranged in proximity to any one of the slits 181 for effective cooling thereof. Though the slits 181 are shown long and narrow, it should be understood that the slits 181 are not limited in shape in practice as long as they allow the air from the passages P to pass through. For example, each slit 181 can be substituted with multiple equivalent round holes.

Figure 13:
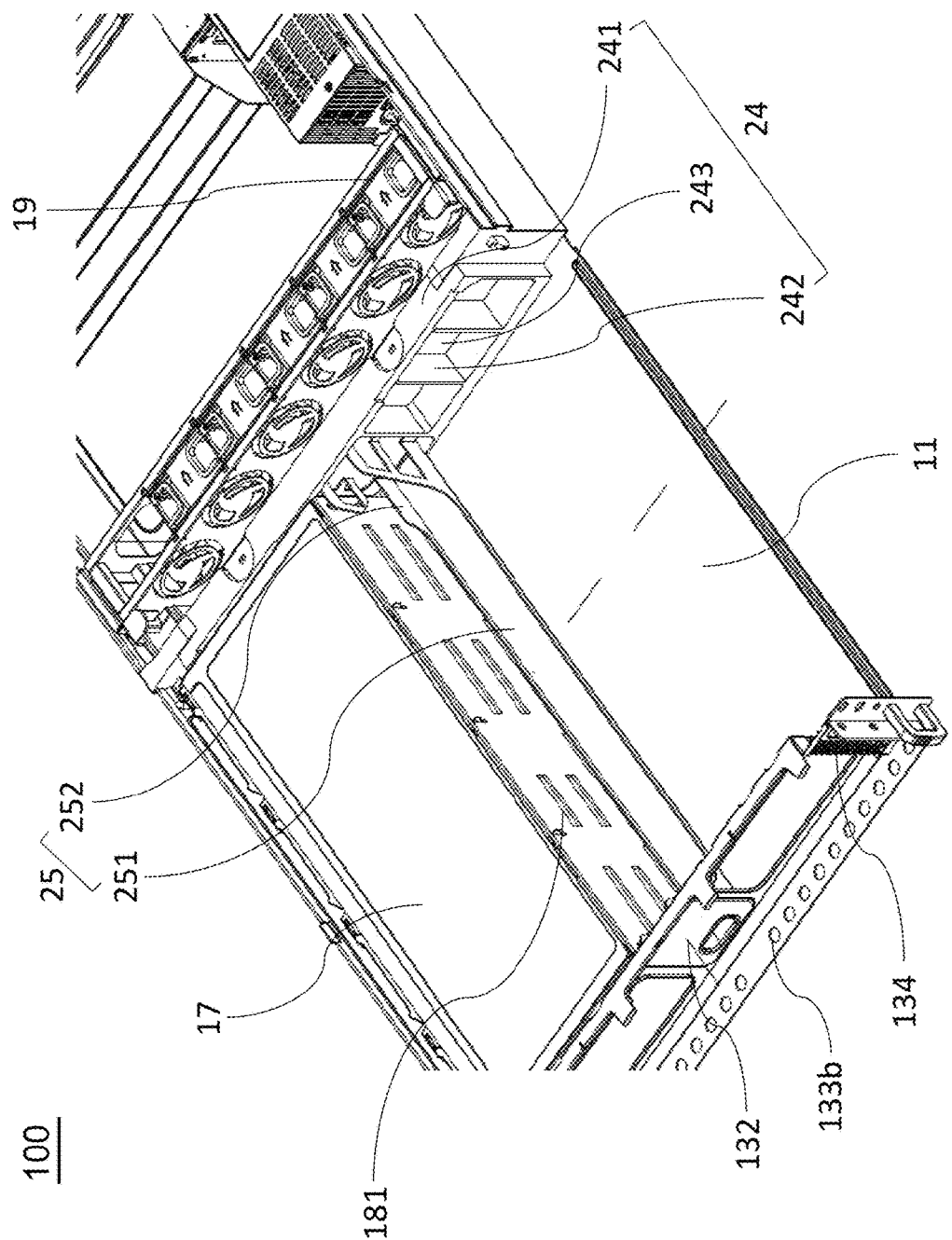
FIG. 13 is a partial enlargement PE of FIG. 8 according to one embodiment of the present disclosure.

FIG. 13 is a partial enlargement PE of FIG. 8 according to one embodiment of the present disclosure. The stress distributing member 24 is arranged across the deck 11 in a side-to-side direction between the side walls 15 with respect to the server system 100 and configured to increase the structural strength of the deck 11 of the server system 100. The stress distributing member 24 comprises a frame 241 and a plurality of dividers 242. The stress distributing member 24 is perforated to form a plurality of openings 243. The plurality of openings 243 are defined between the plurality of dividers 242 within the frame 241. In some embodiments, the plurality of openings 243 are aligned to the lateral separation between the circuit boards. In other words, the area of the stress distributing member aligned to the central corridor is perforated. The plurality of openings 243 not only allows the air drawn by the fan module 19 from the central corridor SC to pass the stress distributing member 24, but also allows cables (not shown) coupled to the circuit boards 18 to pass through as well, and hence the cables can couple to the motherboard. The server system 100 further comprises a spine (second support) 25 arranged between the component housings 17 and is perpendicular to the stress distributing member 24 and the front panel 13 as such. Furthermore, the spine 25 comprises a web (body) 251 and a plurality of flanges (wings) 252. The web 251 arranged between the front panel 13 and the stress distributing member 24 has two ends; one end of the web 251 extends toward the front panel 13, whereas the other end of the web 251 extends toward the stress distributing member 24. The plurality of flanges 252 extending perpendicularly to the deck 11 at the two ends of the web 251 are configured to couple the spine 25 to the stress distributing member 24 and the internal frame 132. As such, the structural strength of the server system 100 between the stress distributing member 24 and the front panel 13 is increased by the spine 25. It should be noted that, the spine 25 is not necessary to be in direct contact with the deck 11. However, the support 25 can be connected directly to the deck 11 and/or the component housings 17 for further structural reinforcement of the server system 100. In one embodiment of the present disclosure, the spine 25 comprises two flanges 252 at each end. At the end proximal to the stress distributing member 24, and the two flanges 252 each couple to one of the dividers 242 of the stress distributing member 24, and thus allowing air and cables (not shown) from the circuit boards 18 to pass through therebetween. At the end proximal to the front panel 13, the cables (not shown) from a UI module 23 pass between the flanges 252. In sum, both cables from the circuit boards 18 and the UI module 23 can be neatly arranged between the flanges 252 of the spine 25.

Figure 14:
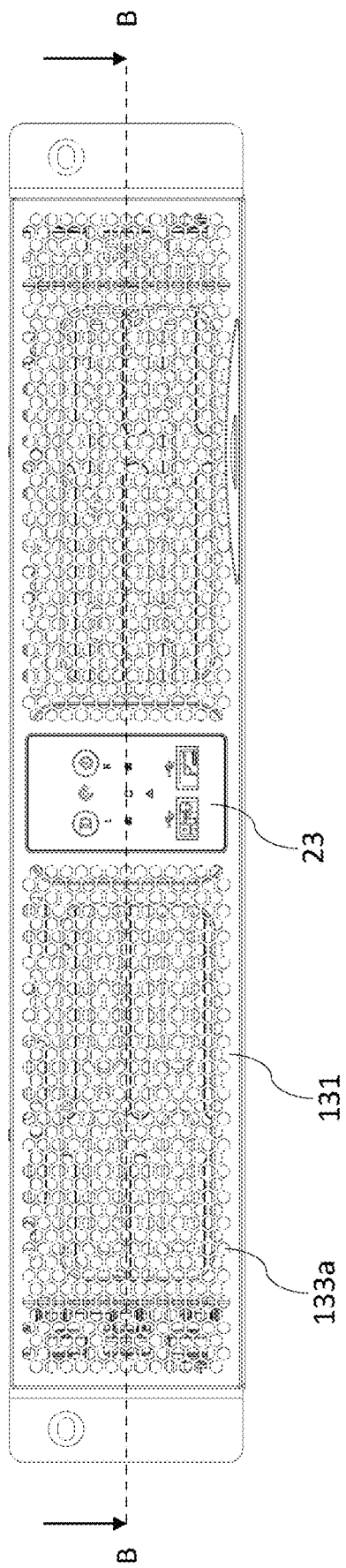
FIG. 14 illustrates a front view of the front panel according to one embodiment of the present disclosure.
Figure 15:
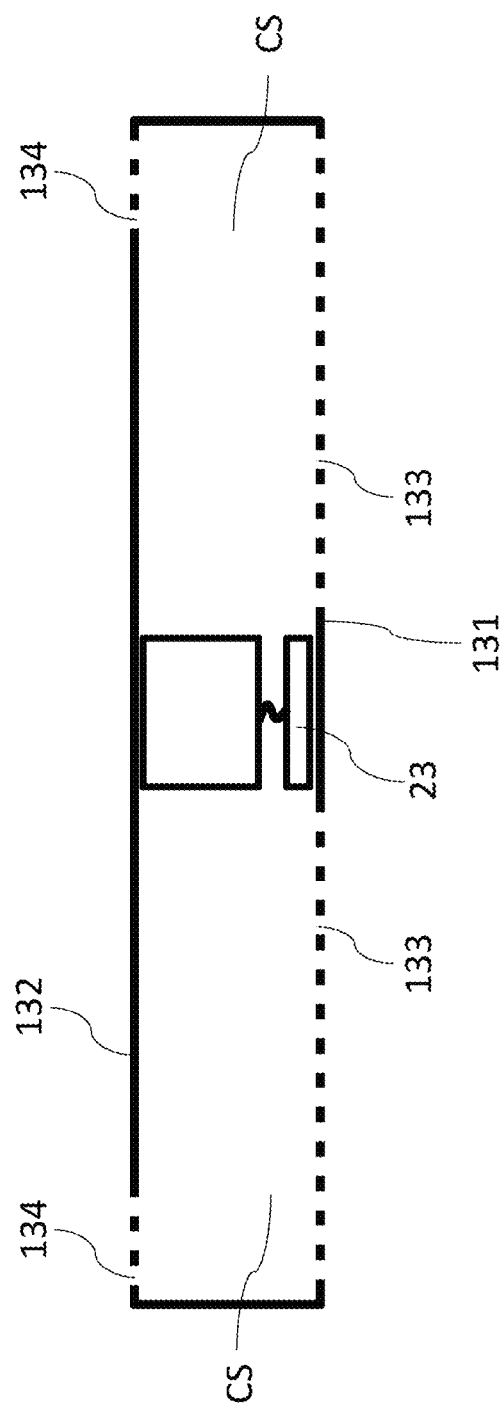
FIG. 15 is a simplified sectional illustration of the B-B cross-section as shown in FIG. 14.

According to one embodiment of the present disclosure, FIG. 14 illustrates a front view of the front panel 13; FIG. 15 is a simplified illustration of a B-B cross-sectional view of FIG. 14. The server system 100 further comprises an UI module 23 installed in the middle of the front panel 13 between the external frame 131 and the internal frame 132, such that at least partially divides the collecting space CS into two equal sections. Moreover, the UI module 23 is configured to separate the collecting space CS from the central corridor SC.

Figure 16:
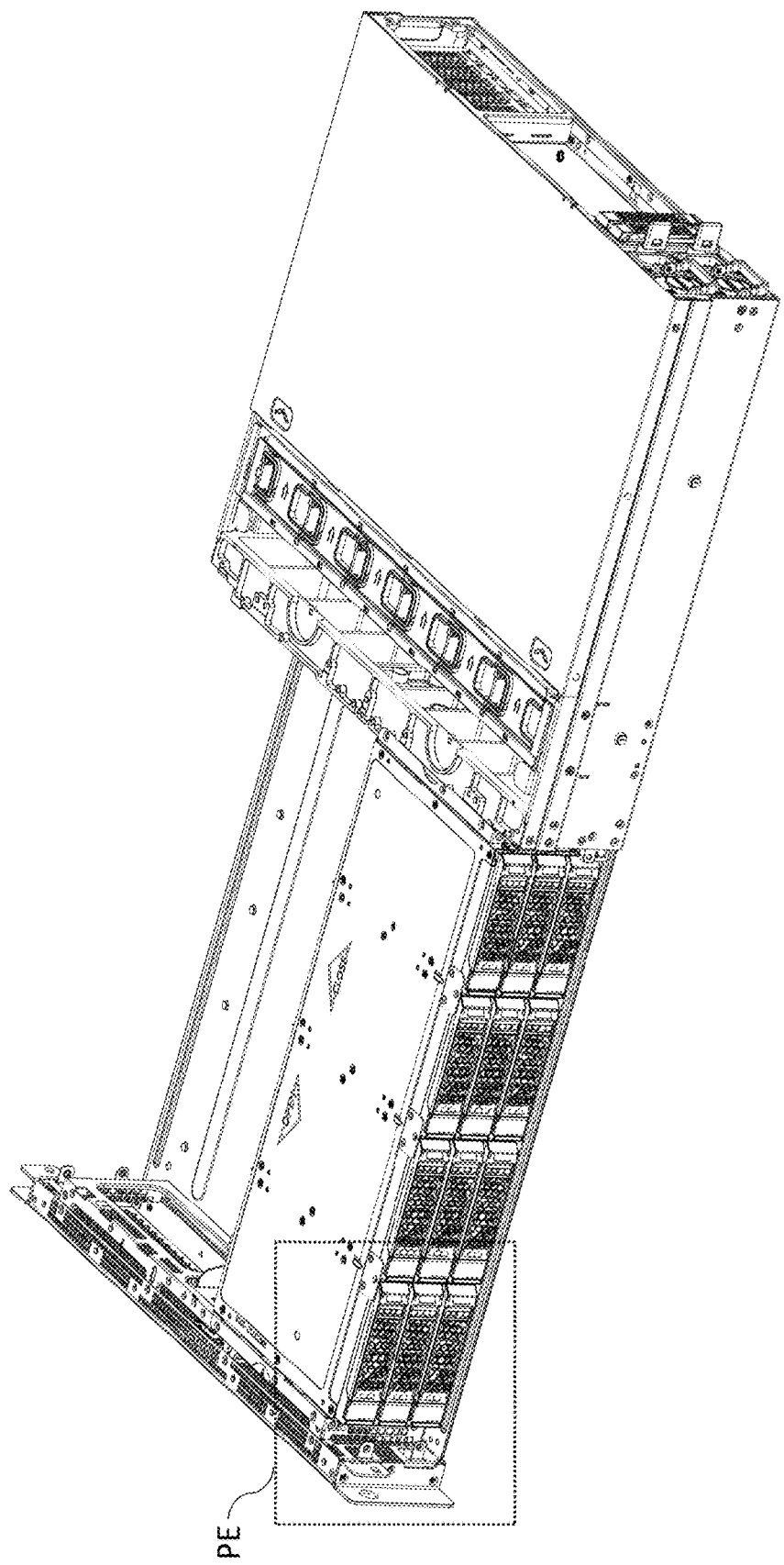
FIG. 16 illustrates another isometric view of the server system according to one embodiment of the present disclosure.
Figure 17:
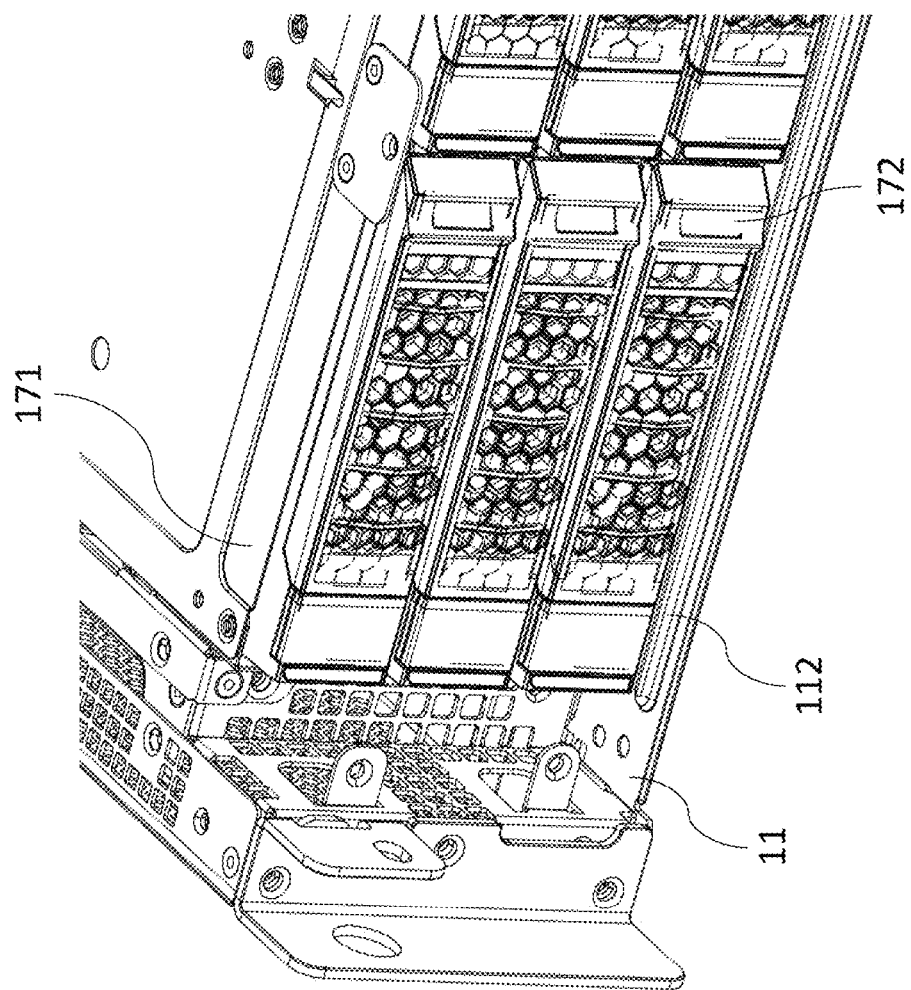
FIG. 17 shows a partial enlargement PE of FIG. 16 according to one embodiment of the present disclosure.

FIG. 16 illustrates the server system 100, and FIG. 17 shows a partial enlargement PE of FIG. 16. In one embodiment of the present disclosure, in the periphery corridor FC, the deck 11 further comprises a bump 112 between a component housing 17 and a door 16 corresponding to the component housing 17. In other words, the bump 112 is protruding from a planar surface of the deck 11 and arranged between the front end of the component housing 17 and a periphery of the deck 11. The bump 112 is configured to support the device docks 172 and the storage drives D at the most bottom row of the component housing 17 when the storage drives D are inserted to or removed from the receiving frame structure 171 of the component housing 17. Therefore, the device docks 172 at the most bottom row are prevented from rubbing against the deck 11 due to the weight of the storage drives D.

Figure 18:
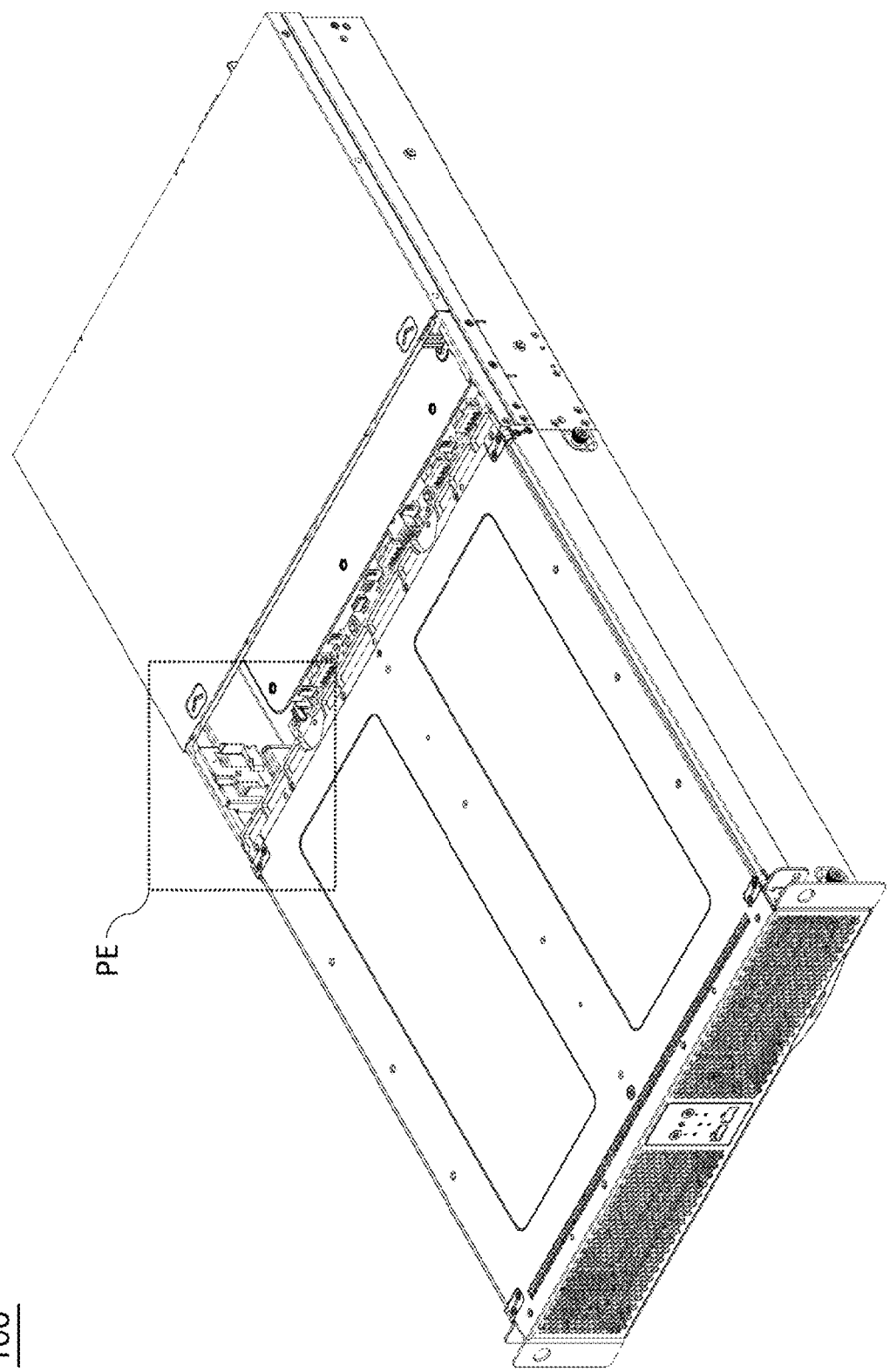
FIG. 18 illustrates another isometric view of the server system according to one embodiment of the present disclosure.
Figure 19:
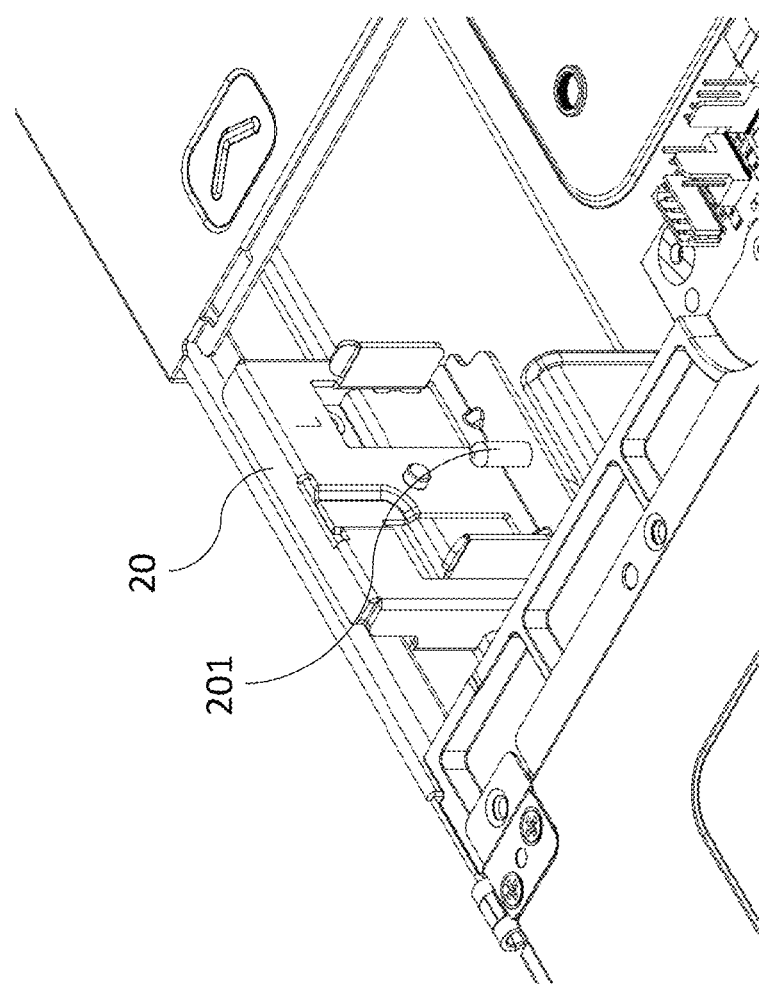
FIG. 19 illustrates a partial enlargement PE of FIG. 18 according to one embodiment of the present disclosure.
Figure 20:
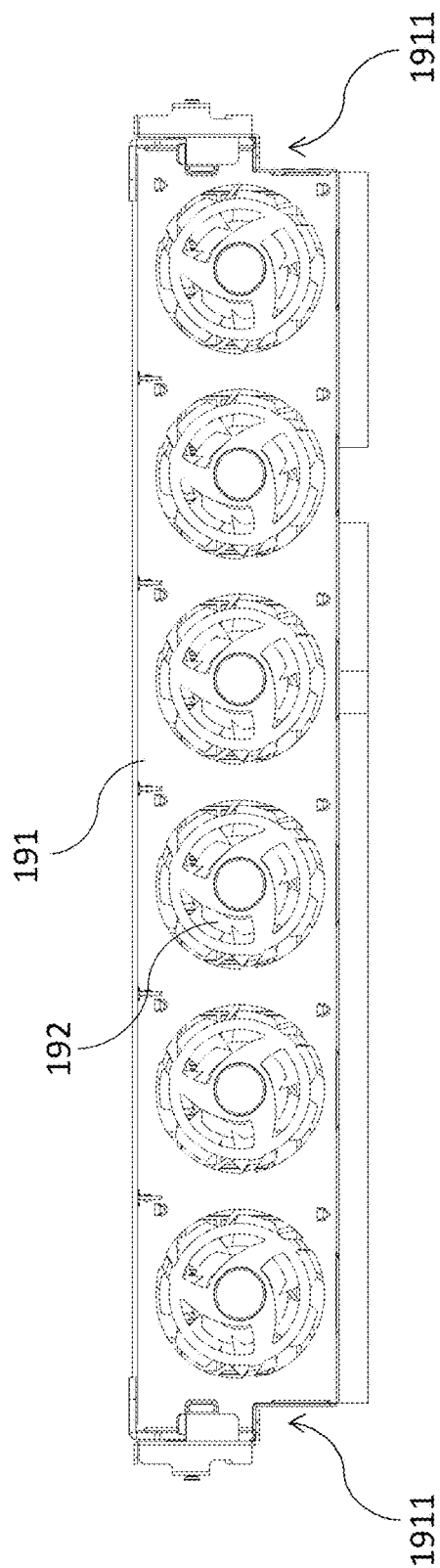
FIG. 20 illustrates a front view of a fan module according to one embodiment of the present disclosure.
Figure 21:
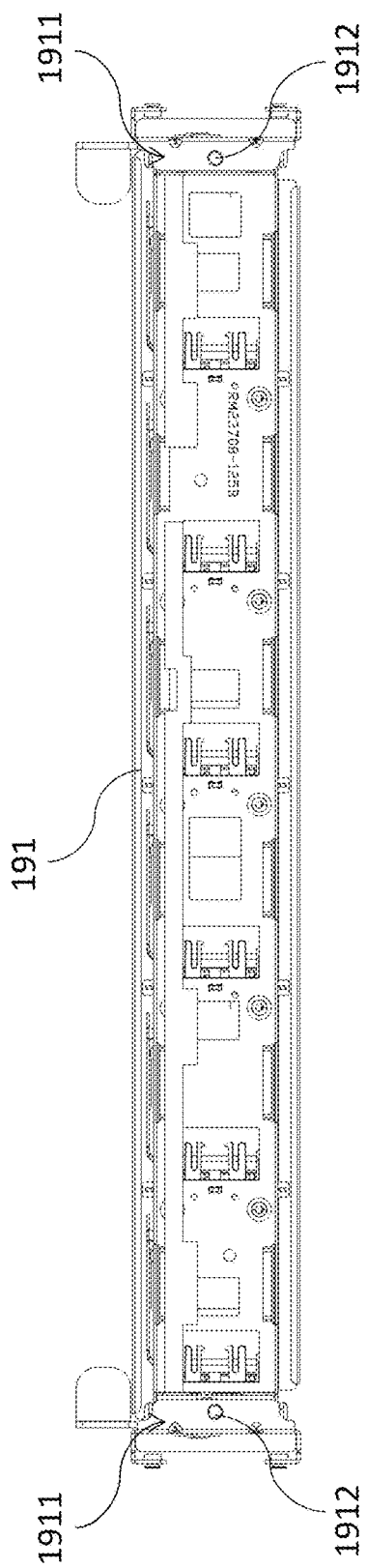
FIG. 21 illustrates a bottom view of the fan module according to one embodiment of the present disclosure.
Figure 22:
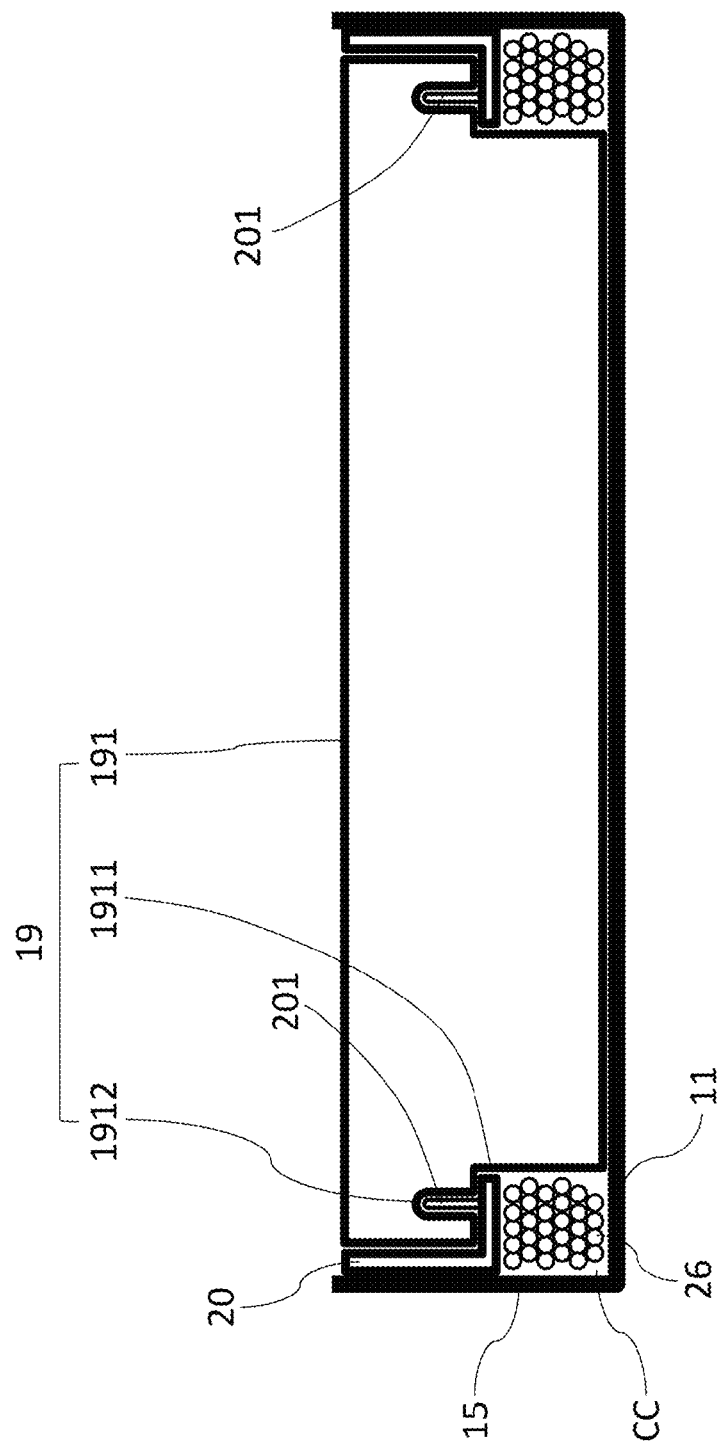
FIG. 22 is a simplified illustration of C-C cross-section of FIG. 4 according to one embodiment of the present disclosure.

In one embodiment of the present disclosure, the fan module 19 comprises a fan bracket 191 and a plurality of fan units 192 disposed therein as shown in FIG. 8. FIG. 18 illustrates the server system 100 having the fan mounts 20, and FIG. 19 shows a partial enlargement PE of FIG. 18; FIG. 20 illustrates a front view of the fan module 19, and FIG. 21 illustrates a bottom view of the fan module 19; FIG. 22 is a simplified illustration of C-C cross-section of FIG. 4. In one embodiment of the present disclosure, the pair of fan mounts 20 are fixed to the side walls 15 without direct connection to the deck 11. In other words, the pair of fan mounts 20 are floating with respect to the deck 11. Each of the fan mounts 20 comprises a guiding structure 201 which is configured to couple to the fan module 19. As shown in FIG. 20, the fan bracket 191 of the fan module 19 comprises two recess portions 1911, which looks like a notch at each lower corner, is arranged one at a side of the fan bracket 191. In FIG. 21, the fan bracket 191 further comprises two receiving structures 1912 integrated on the recess portions 1911 and configured to receive the guiding structures 201 of the fan mounts 20. As depicted by FIG. 19, the guiding structure 201 can be an upward protrusion standing vertically with respect to the deck 11; the receiving structures 1912 can be apertures located at a downward facing portion of the recess portions 1911 as shown in FIG. 21. Therefore, installation of the fan bracket 191 of the fan module 19 to the server system 100 can be guided by alignment between the receiving structures 1912 and corresponding guiding structures 201. It should be noted that, the recess portions 1911 of the fan bracket 191 is not only configured to guide the installation to the fan mounts 20 by the receiving structures 1912 formed thereon, but also to allows the cables 26 from the circuit boards 18 and the UI module 23 to bypass the fan module 19 between corners of the fan module 19, the side walls 15, and the deck 11. As shown in FIG. 22, a cable channel CC is defined between the side walls 15, the deck 11, and the recess portions 1912 of the fan bracket 191, and the cable channel CC is configured to accommodate the cables 26 and which run from the circuit boards 18 and the UI module 23 to the motherboard arranged behind the fan module 19. Therefore, bypassing of the fan module 19 is achieved by the cable channel CC below the recess portions 1912. In another embodiment, a plurality of fan units 192 can be installed to the server system 100 without the fan bracket 191, in which the plurality of fan units 192 are arranged in a door to door direction with respect to the server system 100.

Figure 23:
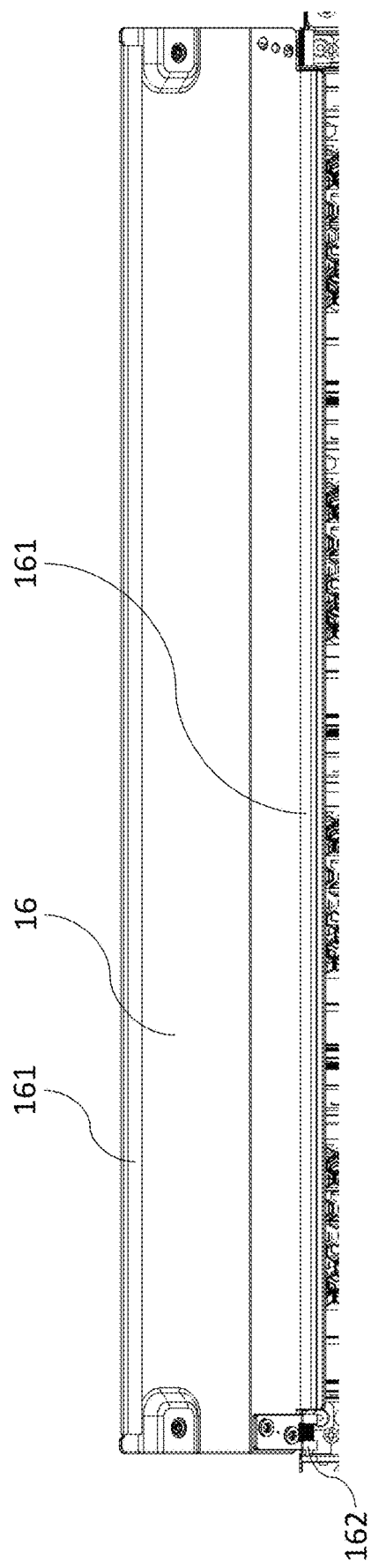
FIG. 23 is a partial enlargement of FIG. 9 according to one embodiment of the present disclosure.

FIG. 23 is a partial enlargement of FIG. 9. In one embodiment of the present disclosure, the door 16 can comprise at least one seal 161. As depicted by FIG. 9, the door 16 comprises two seals 161 on inner face thereof and a door hinge 162 coupled to the top cover 12. As such, the door 16 can be opened by lifting one end proximal to the deck 11. However, in another embodiment, the door hinge 162 can also be coupled to the deck 11, such that facilitate the door 16 to be opened by dropping one end proximal to the top cover 12. When the door 16 is closed, one seal 161 is arranged proximal to the deck 11, whereas the other seal 161 is arranged proximal to the top cover 12. In other words, one seal 161 is installed near the door hinge 162, while the other is installed away from the door hinge 162.

Figure 24:
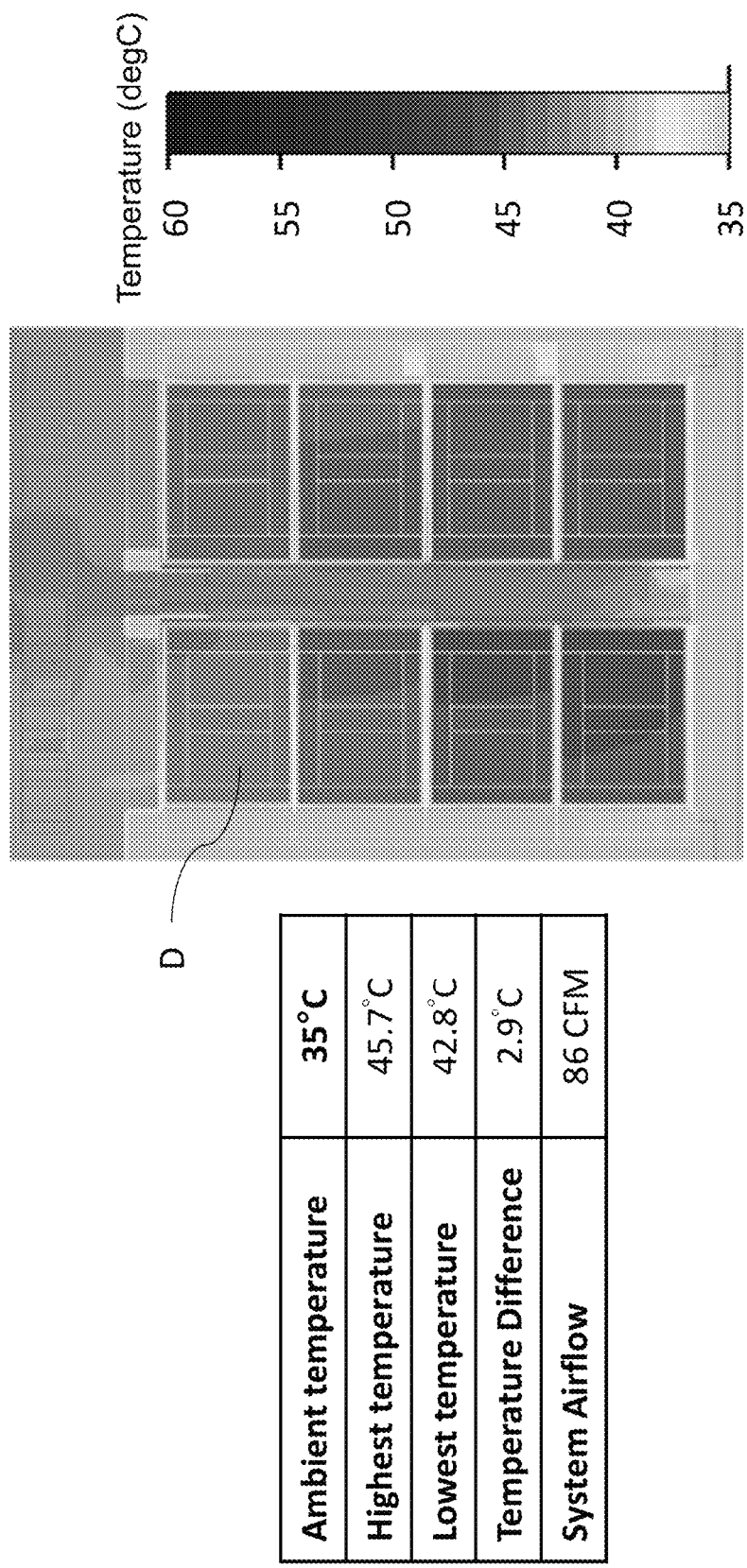
FIG. 24 is a cooling test result of the server system according to one embodiment of the present disclosure.

In one embodiment of the present disclosure, the plurality of storage drives D is 3.5-inch in size. A 3.5-inch storage drive usually outperforms a 2.5-inch storage drive in cache size, RPM (revolution per minute), maximum storage capacity, data transfer speed, and price. However, the 3.5-inch storage drive has a higher power consumption than a 2.5-inch storage drive, hence higher operational temperature. The high operational temperature in combination with the component housing 17 being tightly packed with the 3.5-inch storage drives D, cooling of the server system 100 becomes a very serious issue. According to a cooling test result shown in FIG. 24, the cooling arrangement in FIG. 5 cools the storage drives D in operation with a result of temperature difference at 2.9 degrees Celsius and highest temperature at 45.7 degrees Celsius between the storage drives D. The low temperature difference shows an even and balance cooling across the storage drives D, whereas the highest temperature being lower than 50 degrees Celsius satisfies the general industrial standard of being safe and stable. It should be noted that, the air flowing within the server system 100 between the fan module 19 and the front panel 13 is laminar flow, and the air flowing between the fan module 19 and the back panel 14 is turbulent flow, and the same cooling arrangement can be applied to the storage drives D in 2.5 inch, as long as the physical capacity of the receiving frame structure 171 occupied by the device docks 172 and the storage drives D is more than 70%.

Figure 25:
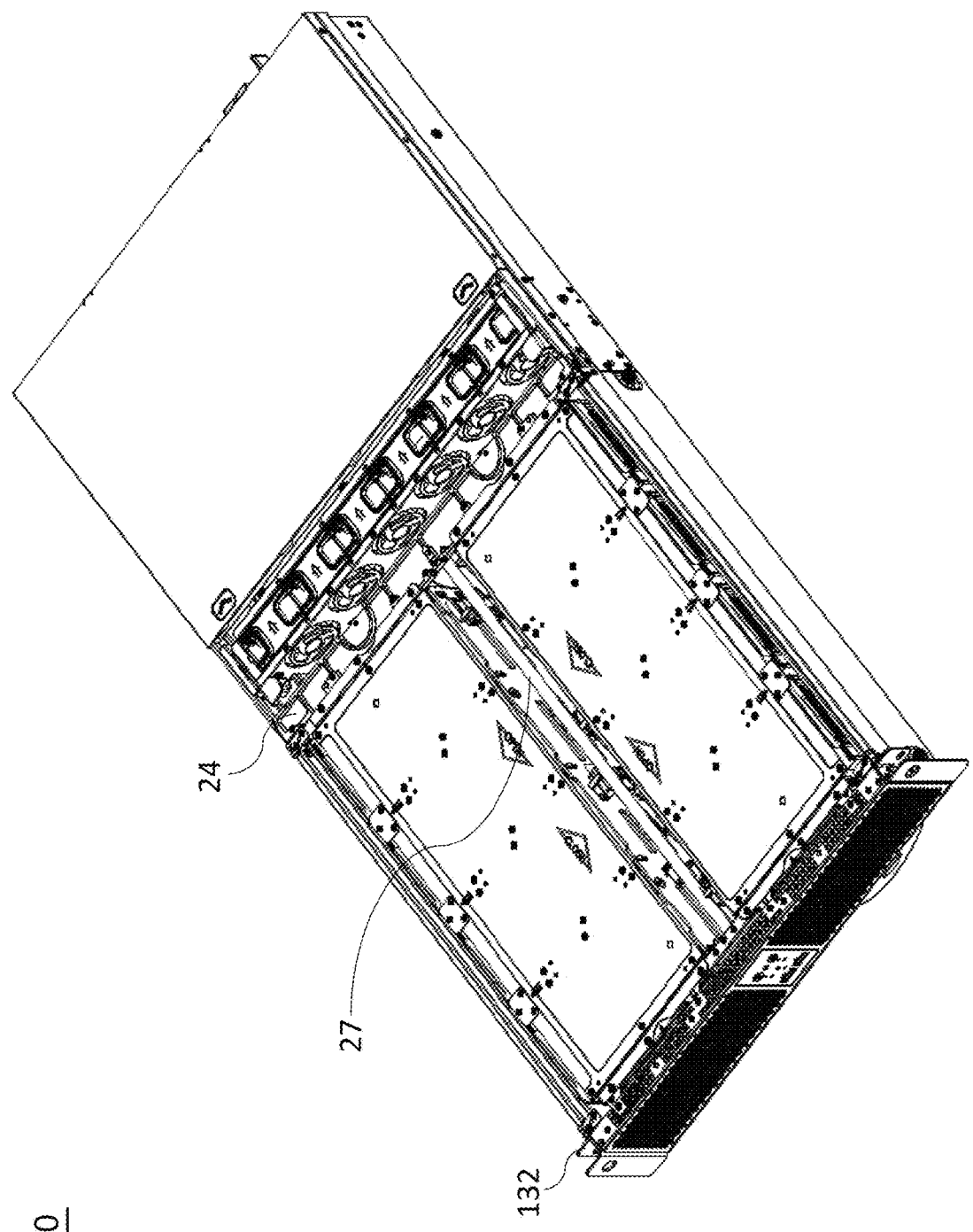
FIG. 25 illustrates another isometric view of the server system according to one embodiment of the present disclosure.
Figure 26A:
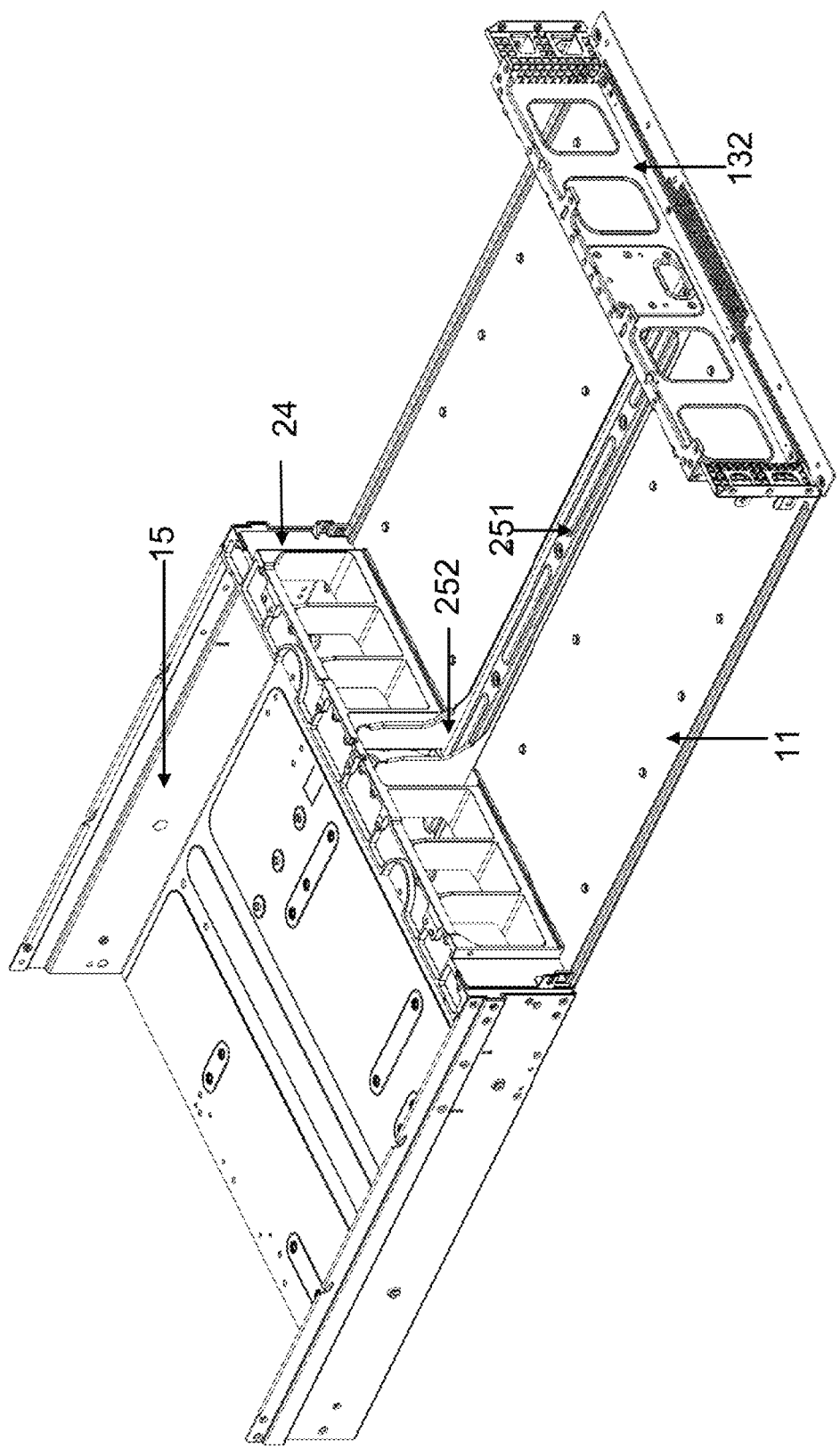
Figure 26B:
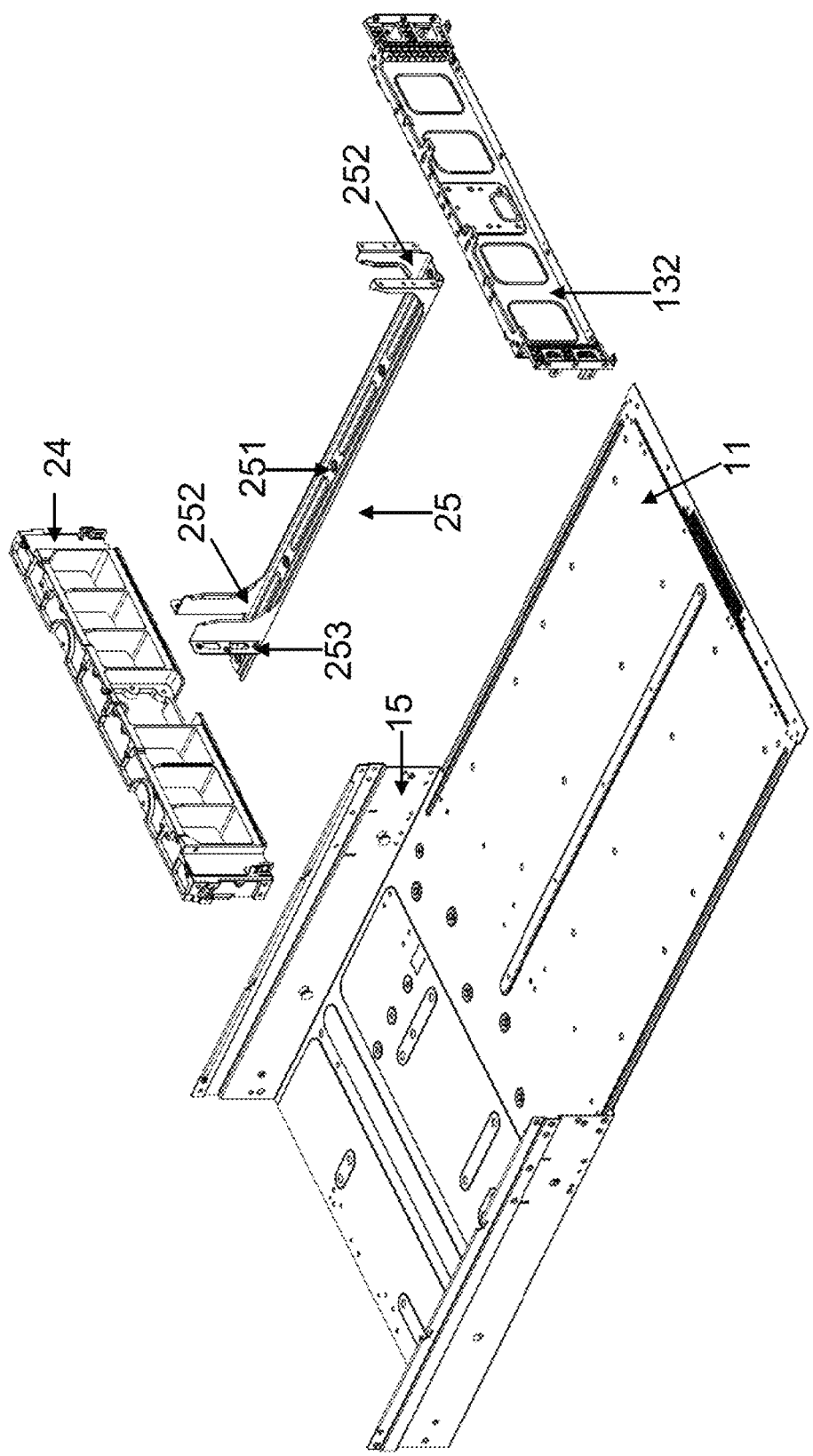
Figure 26E:
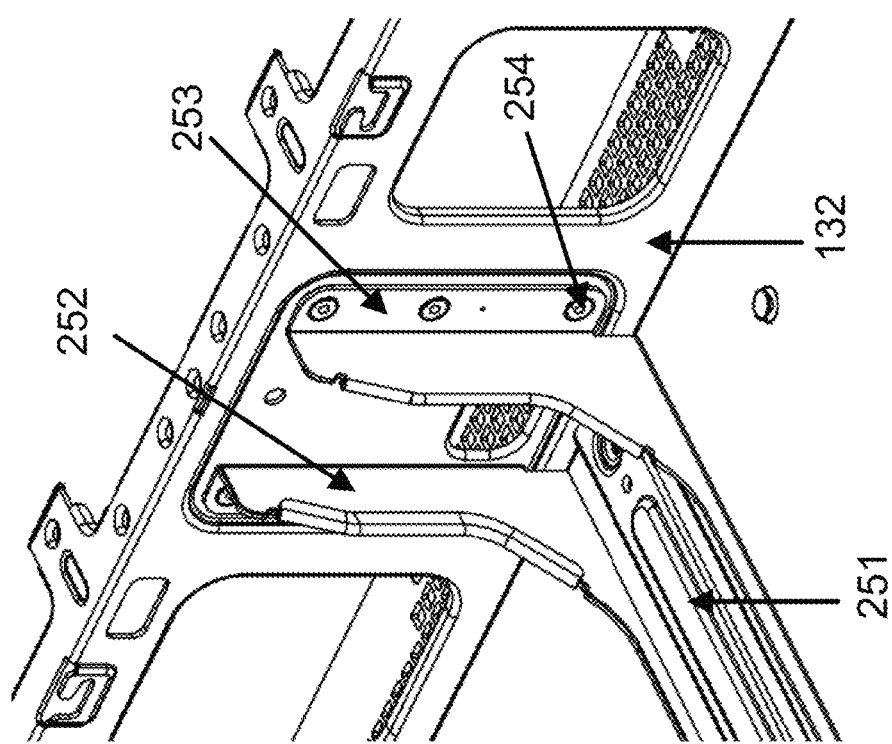

Moreover, the weight of a 3.5-inch storage drive is approximately four times of the weight of a 2.5-inch storage drive. Therefore, carrying twenty-four 3.5-inch storage drives D at a front portion FP of the server system 100 as shown in FIG. 3 puts a lot of stress to the deck 11. FIG. 25 illustrates the server system 100 with a third support 27 according to one embodiment of the present disclosure. To further enhance the structural strength of the deck 11, the third support 27, other than the stress distributing member 24 and the spine 25, can be included in the central corridor SC and coupled between the stress distributing member 24 and the internal frame 132. However, the server system 100 can include at least one from the stress distributing member 24, the spine 25, and the third support 27 in any combination thereof according to one embodiment of the present disclosure.

It should be noted that, though all the exemplary illustrations are decked on a 2U rack mount server, any embodiment of the present disclosure can be incorporated in any other rack mount servers with different dimension, such as 4U, 6U, and 8U rack mount servers.

Figure 30A:
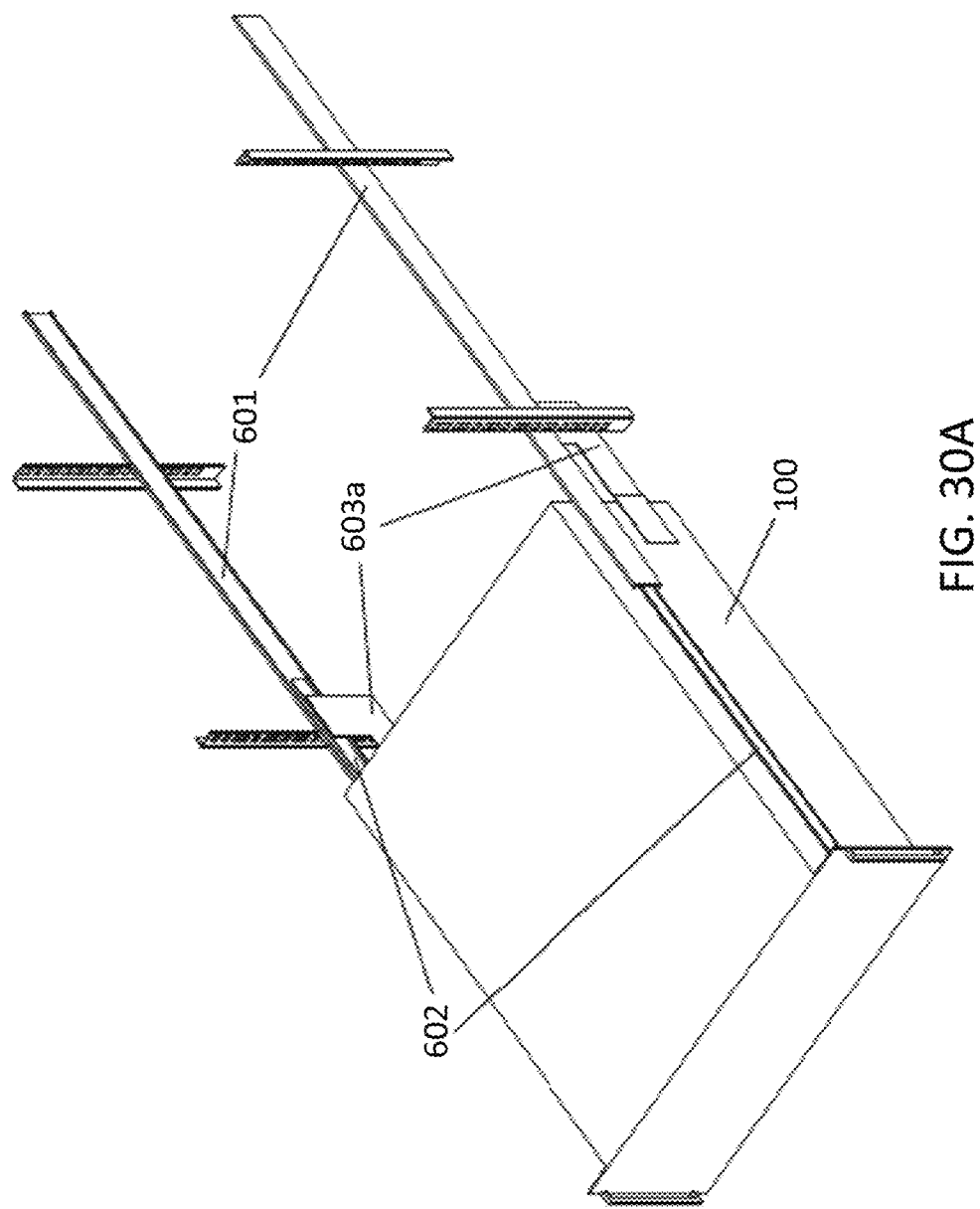
Figure 30B:
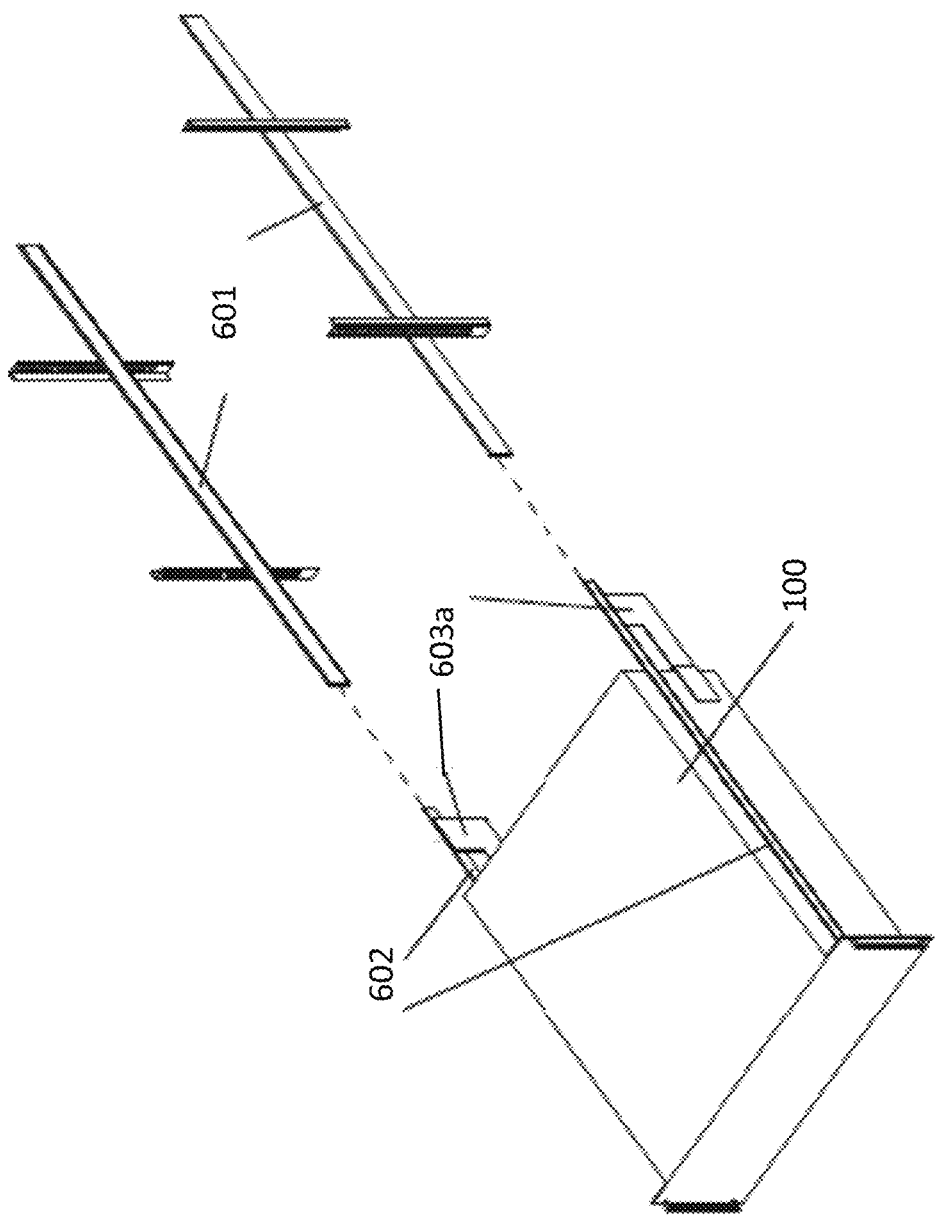
Figure 30C:
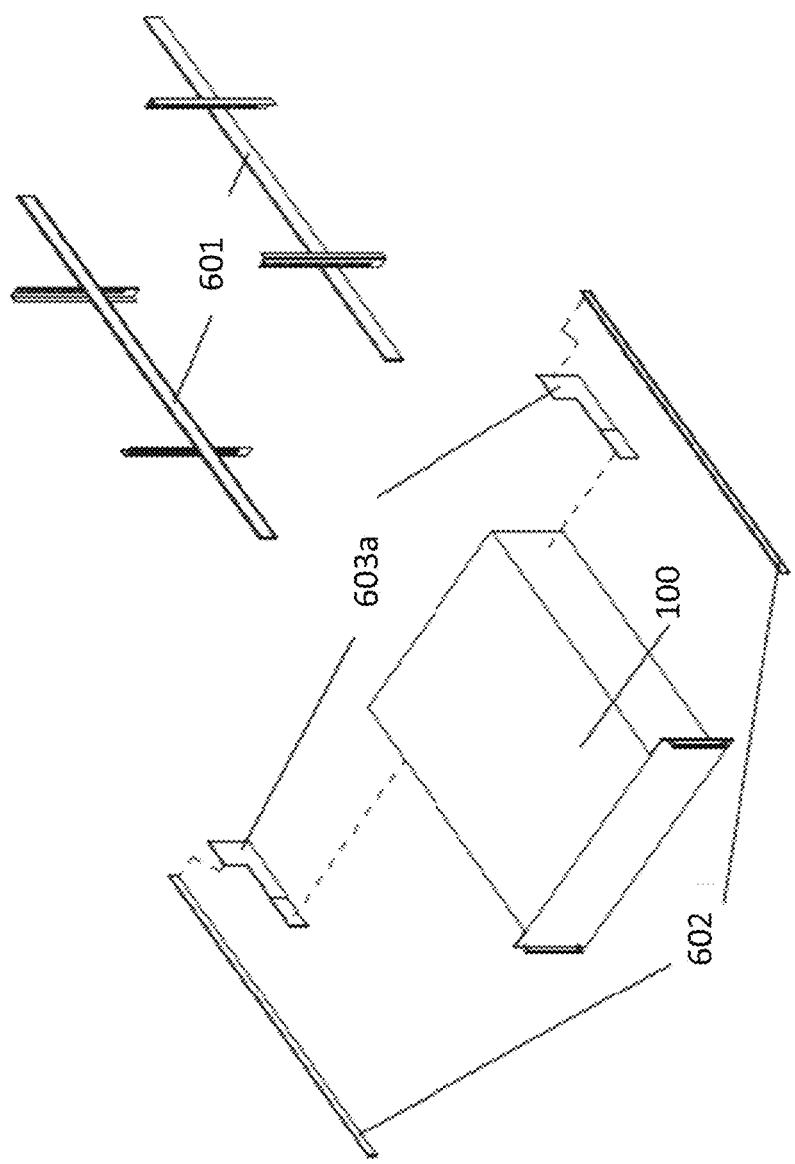
Figure 30D:
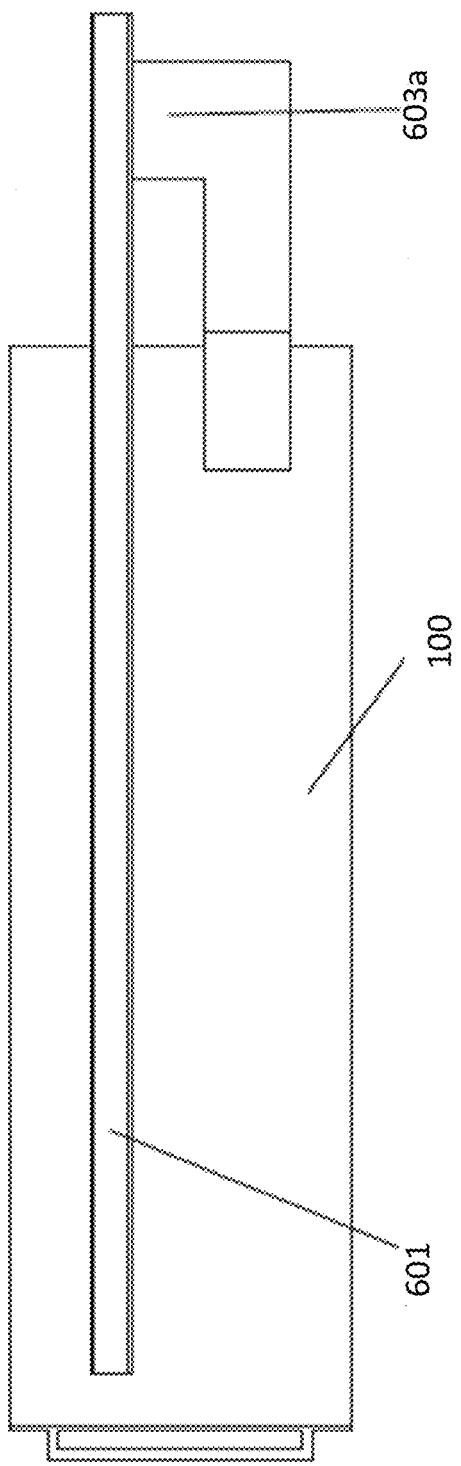
Figure 30E:
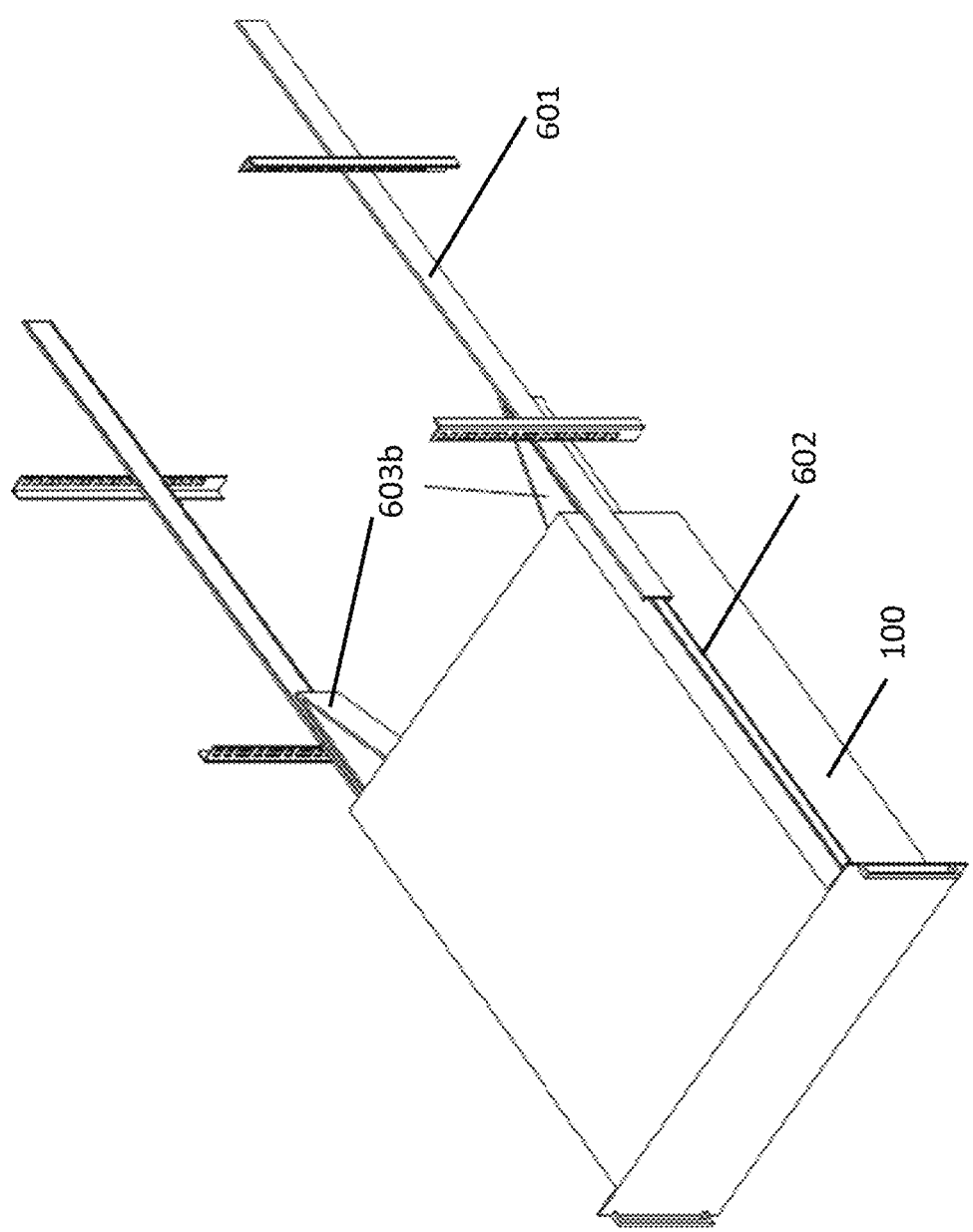
Figure 30F:
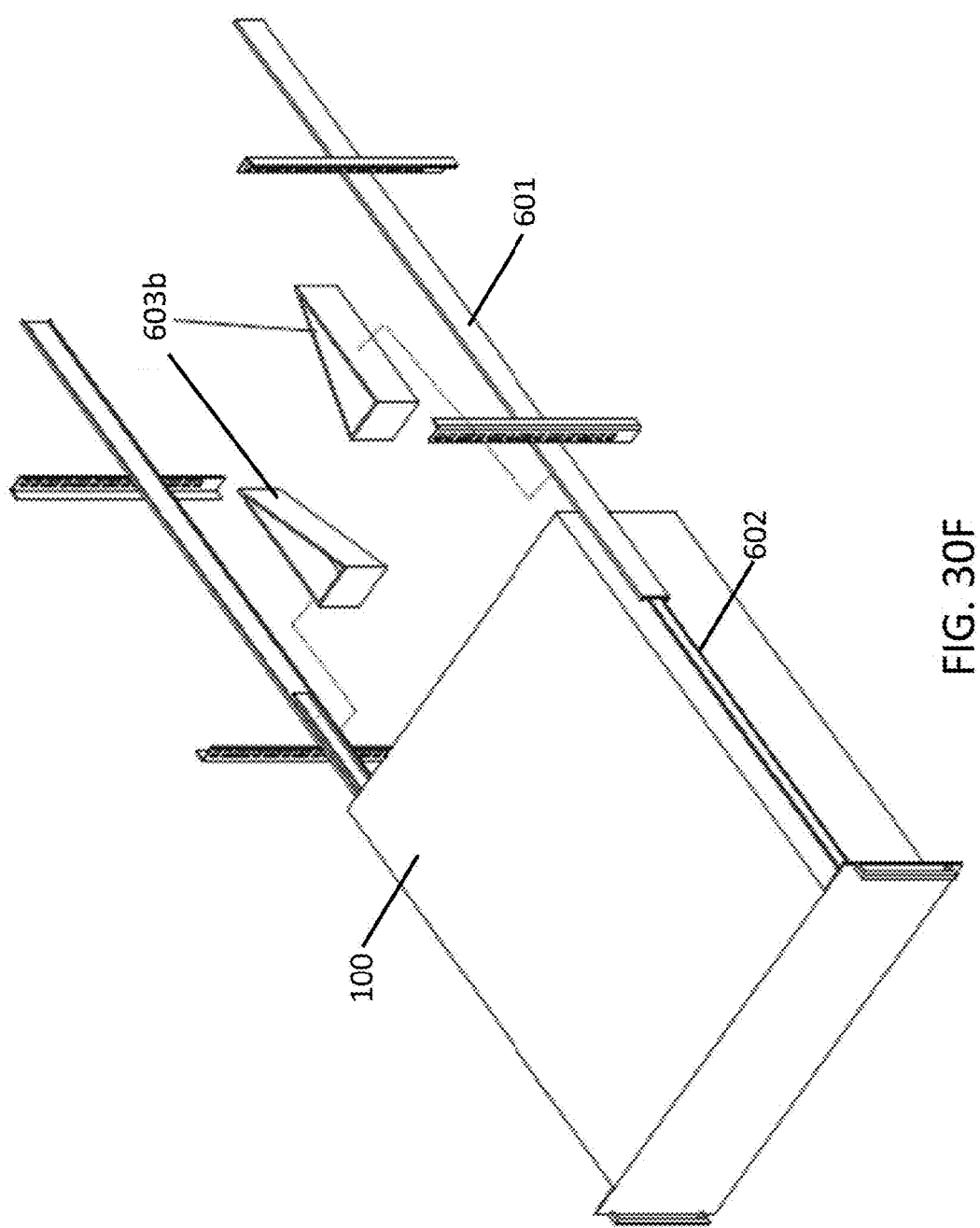
Figure 30H:
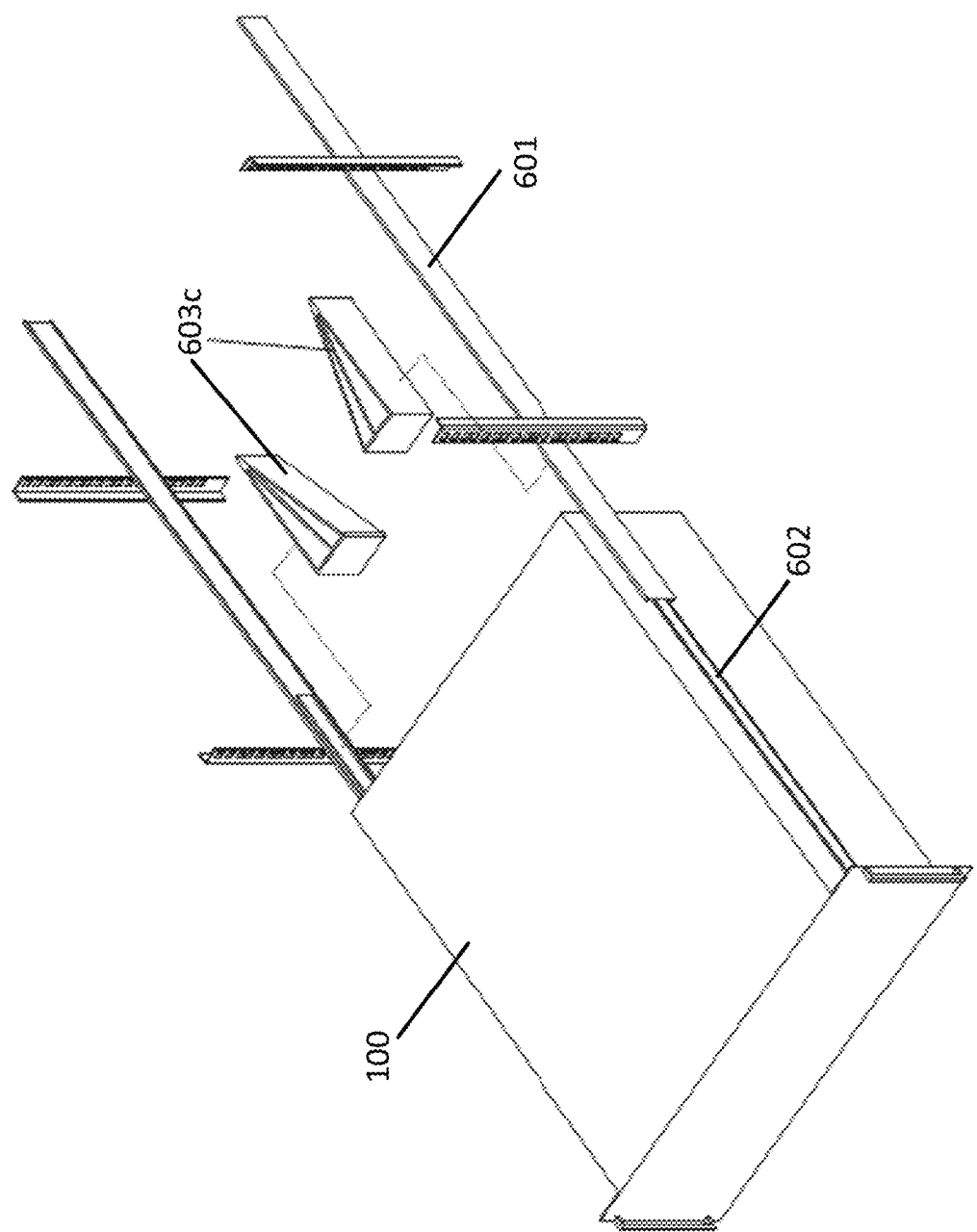
Figure 30J:
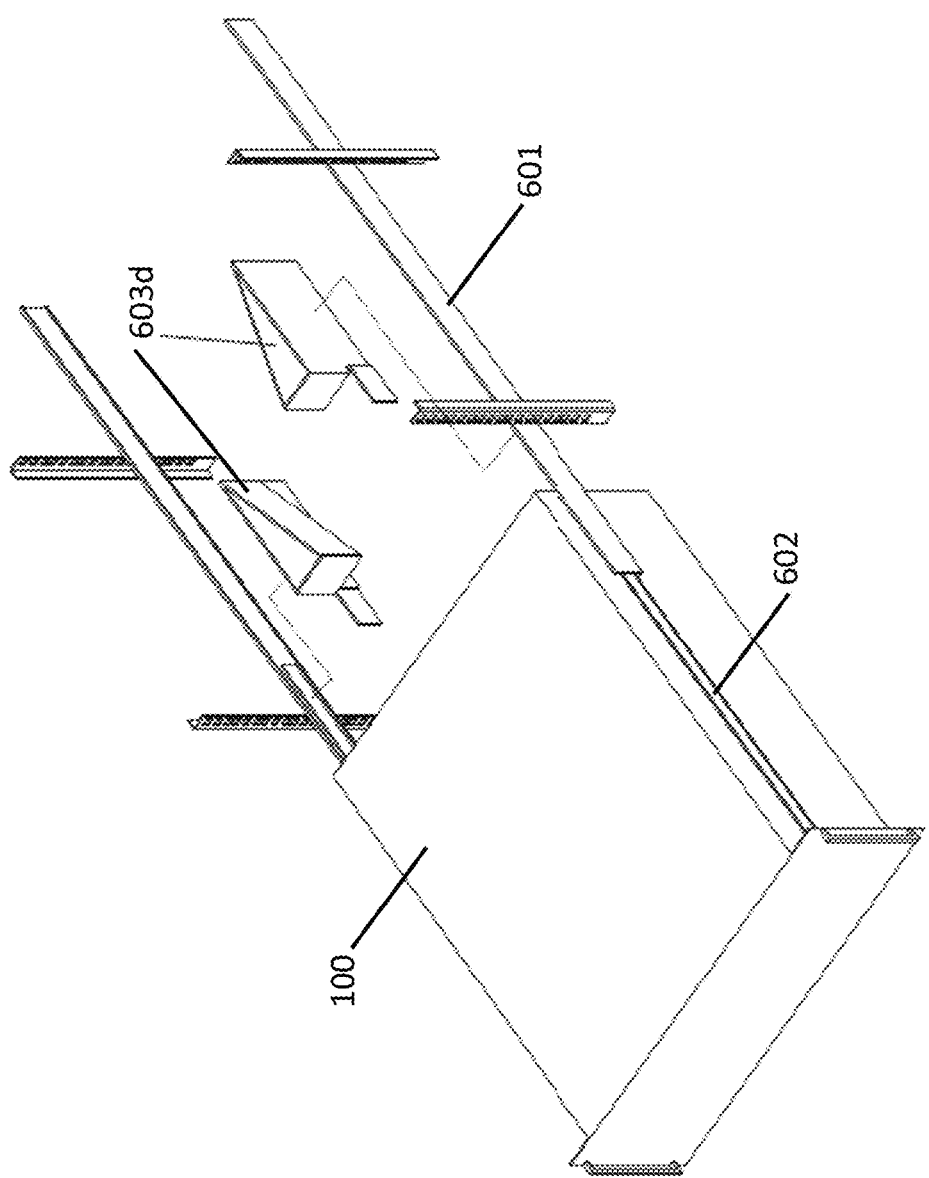

FIG. 30A-30J illustrates an isometric view of a server system mounted to a rack according to one embodiment of the present disclosure. In some embodiments, the racking rails 600 (as shown in FIG. 1) includes an outer rail 601, an inner rail 602 mechanically attached to the outer rail 601, and a supporting bracket 603a, 603b, 603c, and 603d mechanically attached to the inner rail 602. In some embodiments, the inner rail 602 are arranged to mechanically move along the outer rail 601. In some embodiments, the supporting bracket 603a (as shown in FIG. 30A) may be a plate bracket having one end fastened to the inner rail 602 and the other end fastened to the enclosure 100. In an exemplary embodiment, the supporting bracket 603a is fastened to the side wall of the enclosure 100. The plate bracket may be an L-shaped plate bracket. In some embodiments, the supporting bracket 603b (as shown in FIG. 30E) may be a triangle support bracket having one side fastened to the inner rail 602 and another side fastened to the enclosure 100. Further, the supporting bracket 603b has a gusset fastened to the ends of the two sides. In an exemplary embodiment, the supporting bracket 603b is fastened to the back panel of the enclosure 100. In some embodiments, the supporting bracket 603c (as shown in FIG. 30G) may be a triangle support bracket having one side fastened to the inner rail 602 and another side fastened to the enclosure 100. In an exemplary embodiment, the supporting bracket 603c is fastened to the back panel of the enclosure 100. Further, the supporting bracket 603c has two gussets. A first gusset is fastened to the ends of the two sides. A second gusset fastened between the first gusset and the side fastened to the inner rail 602. In some embodiments, the supporting bracket 603d (as shown in FIG. 30I) may be a triangle support bracket having one side fastened to the inner rail 602 and another side fastened to the enclosure 100. Further, the supporting bracket 603d has a gusset fastened to the ends of the two sides. Also, the supporting bracket 603d has a flange extending from the side fastened to the inner rail 602. The flange having an end fastened to the side wall of the enclosure 100.

Accordingly, one aspect of the instant disclosure provides an enclosure that comprises a deck; a top cover disposed over the deck; a pair of side walls, a pair of side doors, and a front panel disposed between the deck and the top cover, wherein the pair of side doors being arranged perpendicular to the front panel, each of the pair of side doors being arranged at substantially straight angle with one of the pair of side walls, the enclosure having a rear section defined by an area between the pair of side walls and a front section defined by an area between the pair of side doors; a pair of component housings arranged in the front section, wherein each of the component housing having a front end facing one of the side doors and a back end facing another one of the side doors; and a pair of circuit boards respectively arranged to cover the back ends of the component housings, wherein each of the circuit boards are perforated to form a plurality of slits, a central corridor is defined by a distance between the pair of circuit boards, the plurality of slits are configured to allow air exhausted from the front end of the component housing to flow towards the central corridor; the slits are arranged to expose back ends of the storage component.

In some embodiments, the enclosure further comprises a stress distributing member that traverses an entire width of the deck, the stress distributing member being arranged perpendicular to the pair of side walls and the pair of side doors.

In some embodiments, the stress distributing member comprises a pair of door stops protruding from areas of the stress distributing member and arranged between the side doors and the component housings, the door stops configured to seal a gap between the side doors and the side walls.

In some embodiments, the enclosure further comprises a spine mechanically attached to the deck and traversing across a length of the front section and extending beyond the stress distributing member.

In some embodiments, the pair of side walls are fastened to ends of the stress distributing member.

In some embodiments, the pair of side doors are mechanically attached to the top cover and configured to angle away from the enclosure.

In some embodiments, each of the pair of side doors comprises a door panel configured to angle away from a corresponding side wall; and a sealing flange configured to angle away from the top cover.

In some embodiments, the enclosure further comprises a seal strip disposed between the deck and the top cover and attached to the top cover. A thickness of the seal strip is no less than a distance between the top cover and the sealing flange when the side door is at rest.

In some embodiments, each of the component housing has a top surface and a bottom surface respectively fastened to the top cover and the deck.

In some embodiments, the component housing is configured to receive electronic devices in a stacked array formation.

In some embodiments, the front panel comprises an external frame; and an internal frame opposite the external frame. A collecting space is formed between the external frame and the internal frame. The components housing abuts the internal frame. An area of perforation of the external frame is greater than an area of perforation of the internal frame. The internal frame is perforated in an area projectively across the extending part of the stress distributing member.

Accordingly, one aspect of the instant disclosure provides an enclosure that comprises a deck; a top cover disposed over the deck; a pair of side doors, and a front panel disposed between the deck and the top cover; a stress distributing member that traverses an entire width of the deck; a pair of component housings arranged between the stress distributing member and the front panel. Each of the component housing has a front end and a back end opposite the front end, the stress distributing member extends beyond the front ends of the component housings, the front end of the component housings, the side door, the top cover, the deck, and an extending portion of the stress distributing member form a lateral separation that defines a periphery corridor.

In some embodiments, the enclosure further comprises a spine disposed between the stress distributing member and the deck, arranged perpendicular to the stress distributing member, and extending in opposite directions of the stress distributing member.

In some embodiments, the enclosure further comprises a pair of circuit boards arranged between the pair of component housings and each at an angle from the deck, wherein each of the circuit boards are perforated to form a plurality of slits, a central corridor is defined by a distance between the pair of circuit boards, the front end of the component housing are perforated to allow air from outside the component housing to flow towards the central corridor through the slits, the slits are arranged along the back end of the component housing.

In some embodiments, the enclosure further comprises a pair of side walls fastened to corresponding ends of the stress distributing member.

In some embodiments, each of the pair of side doors comprises a door panel configured to angle away from a corresponding side wall; and a sealing flange configured to angle away from the top cover.

In some embodiments, the enclosure further comprises a seal strip disposed between the side door and the top cover, the seal strip configured to prevent air from entering through a space between the side door and the top cover.

In some embodiments, the stress distributing member comprises a pair of door stops protruding from areas of the stress distributing member and arranged between the side doors and the component housings, the door stops configured to seal a gap between the side doors and the side walls.

In some embodiments, the pair of side doors are mechanically attached to the top cover and configured to angle away from the enclosure.

In some embodiments, the front panel comprises an external frame that is perforated; and an internal frame that is perforated and disposed opposite the external frame. A collecting space is formed between the external frame and the internal frame, the components housing is fastened to the front panel, an area of perforation of the external frame is greater than an area of perforation of the internal frame, the area of perforation of the internal frame is arranged between the front end of the component housing and the side door.

The embodiments shown and described above are only examples. Many details are often found in this field of art thus many such details are neither shown nor described. Even though numerous characteristics and advantages of the present technology have been set forth in the foregoing description, together with details of the structure and function of the present disclosure, the disclosure is illustrative only, and changes may be made in the detail, especially in matters of shape, size, and arrangement of the parts within the principles of the present disclosure, up to and including the full extent established by the broad general meaning of the terms used in the claims. It will therefore be appreciated that the embodiments described above may be modified within the scope of the claims.

What is claimed is:

1. An enclosure, comprising:
   a deck;
   a top cover disposed over the deck;
   a pair of side walls, a pair of side doors, and a front panel disposed between the deck and the top cover, wherein:
      the pair of side doors are arranged perpendicular to the front panel,
      each of the pair of side doors is arranged at a substantially straight angle with one of the pair of side walls, and
      the enclosure has a rear section defined by an area between the pair of side walls and a front section defined by an area between the pair of side doors;
   a pair of component housings arranged in the front section,
      wherein each of the pair of component housings has a front end facing one of the side doors and a back end facing another one of the side doors; and
   a pair of circuit boards respectively arranged to cover the back ends of the pair of component housings, wherein:
      each of the pair of circuit boards is perforated to form a plurality of slits,
      a central corridor is defined by a distance between the pair of circuit boards,
      the plurality of slits is configured to allow air exhausted from the front ends of the pair of component housings to flow towards the central corridor, and
      the plurality of slits is arranged to expose back ends of a plurality of storage components of the enclosure.

2. The enclosure of claim 1, further comprising:
   a stress distributing member that traverses an entire width of the deck, the stress distributing member being arranged perpendicular to the pair of side walls and the pair of side doors.

3. The enclosure of claim 2, wherein the stress distributing member comprises:
   a pair of door stops protruding from areas of the stress distributing member and arranged between the pair of side doors and the pair of component housings, the pair of door stops configured to seal a gap between the pair of side doors and the pair of side walls.

4. The enclosure of claim 2, further comprising:
   a spine mechanically attached to the deck and traversing across a length of the front section and extending beyond the stress distributing member.

5. The enclosure of claim 2, wherein the pair of side walls are fastened to ends of the stress distributing member.

6. The enclosure of claim 1, wherein the pair of side doors are mechanically attached to the top cover and configured to angle away from the enclosure.

7. The enclosure of claim 1, wherein each of the pair of side doors comprises:
   a door panel configured to angle away from a corresponding side wall; and
   a sealing flange configured to angle away from the top cover.

8. The enclosure of claim 7, further comprising:
   a seal strip disposed between the deck and the top cover and attached to the top cover, wherein a thickness of the seal strip is no less than a distance between the top cover and the sealing flange when each side door is at rest.

9. The enclosure of claim 1, wherein each of the pair of component housings has a top surface and a bottom surface respectively fastened to the top cover and the deck.

10. The enclosure of claim 1, wherein each of the pair of component housings is configured to receive electronic devices in a stacked array formation.

11. The enclosure of claim 2, wherein the front panel comprises:
an external frame; and
an internal frame opposite the external frame, wherein:
a collecting space is formed between the external frame and the internal frame,
the pair of component housings abuts the internal frame,
an area of perforation of the external frame is greater than an area of perforation of the internal frame, and
the internal frame is perforated in an area projectively across an extending part of the stress distributing member.

12. An enclosure, comprising:
a deck;
a top cover disposed over the deck;
a pair of side doors, and a front panel disposed between the deck and the top cover;
a stress distributing member that traverses an entire width of the deck; and
a pair of component housings arranged between the stress distributing member and the front panel, wherein:
each of the pair of component housings has a front end and a back end opposite the front end,
the stress distributing member extends beyond the front ends of the pair of component housings, and
the front ends of the pair of component housings, the pair of side doors, the top cover, the deck, and an extending portion of the stress distributing member form a lateral separation that defines a periphery corridor.

13. The enclosure of claim 12, further comprising:
a spine disposed between the stress distributing member and the deck, arranged perpendicular to the stress distributing member, and extending in opposite direction of the stress distributing member.

14. The enclosure of claim 12, further comprising:
a pair of circuit boards arranged between the pair of component housings and each of the pair of circuit boards arranged at an angle from the deck, wherein:
each of the pair of circuit boards is perforated to form a plurality of slits,
a central corridor is defined by a distance between the pair of circuit boards,
the front ends of the pair of component housings are perforated to allow air from outside the pair of component housings to flow towards the central corridor through the plurality of slits, and
the plurality of slits is arranged along the back end of the pair of component housings.

15. The enclosure of claim 12, further comprising:
a pair of side walls fastened to corresponding ends of the stress distributing member.

16. The enclosure of claim 15, wherein the stress distributing member comprises:
a pair of door stops protruding from areas of the stress distributing member and arranged between the pair of side doors and the pair of component housings, the pair of door stops configured to seal a gap between the pair of side doors and the pair of side walls.

17. The enclosure of claim 12, wherein each of the pair of side doors comprises:
a door panel configured to angle away from a corresponding side wall; and
a sealing flange configured to angle away from the top cover.

18. The enclosure of claim 17, further comprising:
a seal strip disposed between each side door and the top cover, the seal strip configured to prevent air from entering through a space between each side door and the top cover.

19. The enclosure of claim 12, wherein the pair of side doors is mechanically attached to the top cover and configured to angle away from the enclosure.

20. The enclosure of claim 12, wherein the front panel comprises:
an external frame that is perforated; and
an internal frame that is perforated and disposed opposite the external frame, wherein:
a collecting space is formed between the external frame and the internal frame,
the pair of component housings is fastened to the front panel,
an area of perforation of the external frame is greater than an area of perforation of the internal frame, and
the area of perforation of the internal frame is arranged between the front end of each component housing and each side door.

21. The enclosure of claim 12, wherein each of the pair of component housings is configured to receive electronic devices in a stacked array formation.

* * * * *